(12) United States Patent
Taniguchi

(10) Patent No.: US 8,648,415 B2
(45) Date of Patent: Feb. 11, 2014

(54) SEMICONDUCTOR DEVICE WITH IMPURITY REGION WITH INCREASED CONTACT AREA

(76) Inventor: Koji Taniguchi, Tokyo (JP)

( * ) Notice: Subject to any disclaimer, the term of this patent is extended or adjusted under 35 U.S.C. 154(b) by 307 days.

(21) Appl. No.: 12/967,089

(22) Filed: Dec. 14, 2010

(65) Prior Publication Data

US 2011/0147834 A1      Jun. 23, 2011

(30) Foreign Application Priority Data

Dec. 18, 2009   (JP) .................. 2009-288045

(51) Int. Cl.
*H01L 29/66*   (2006.01)
(52) U.S. Cl.
USPC .................. 257/334; 257/331; 257/E27.091

(58) Field of Classification Search
USPC .......... 257/E27.091, 754, E23.164, 331, 334; 438/647
See application file for complete search history.

(56) References Cited

U.S. PATENT DOCUMENTS

| 5,547,889 A | * | 8/1996 | Kim ............................. 438/242 |
| 6,133,599 A | * | 10/2000 | Sung et al. .................... 257/296 |
| 2008/0242024 A1 | * | 10/2008 | Sugioka ........................ 438/259 |
| 2009/0166735 A1 | * | 7/2009 | Iwasa ............................ 257/337 |

FOREIGN PATENT DOCUMENTS

| JP | 2006-339476 | 12/2006 |
| JP | 2007-081095 | 3/2007 |

* cited by examiner

*Primary Examiner* — Daniel Luke
(74) *Attorney, Agent, or Firm* — Young & Thompson

(57) ABSTRACT

A semiconductor device includes a semiconductor substrate, an impurity region in the semiconductor substrate, and a conductive layer contacting a top surface of the impurity region and at least a side surface of the impurity region.

7 Claims, 34 Drawing Sheets

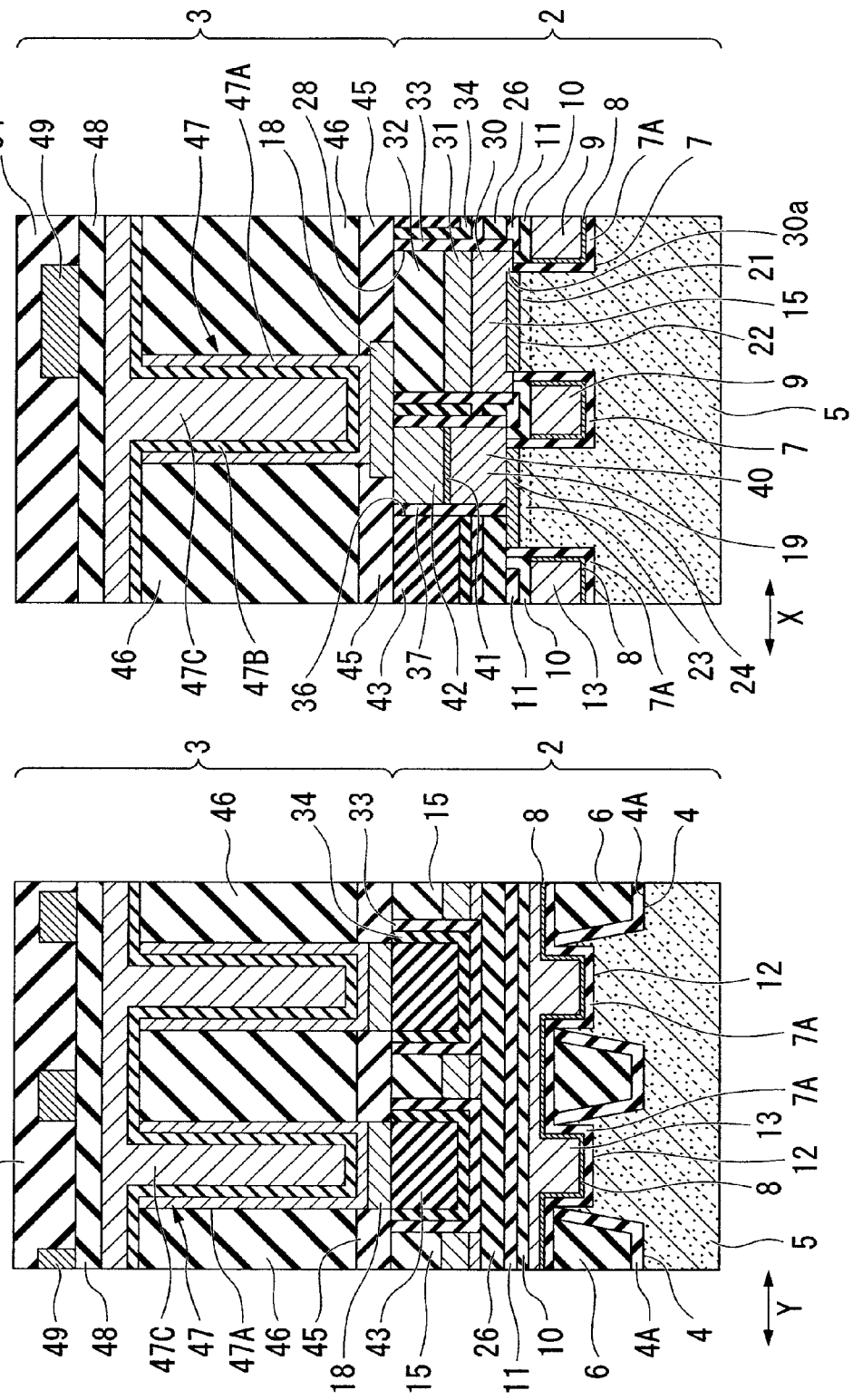

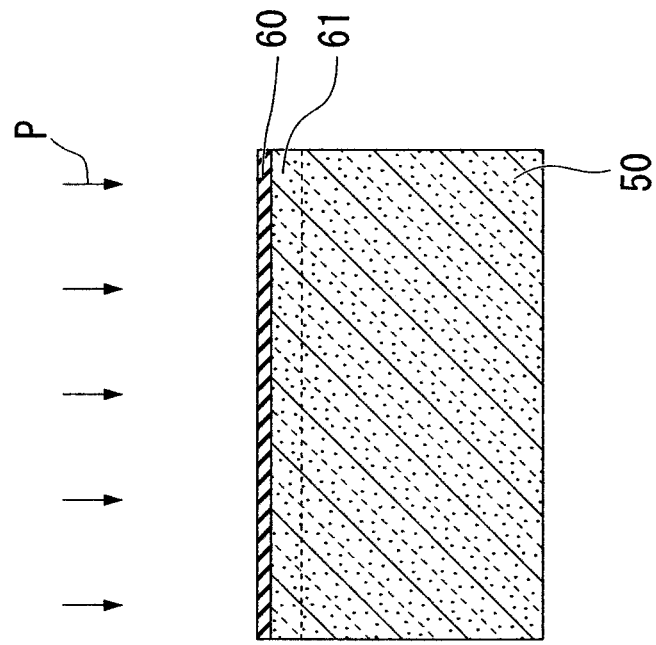
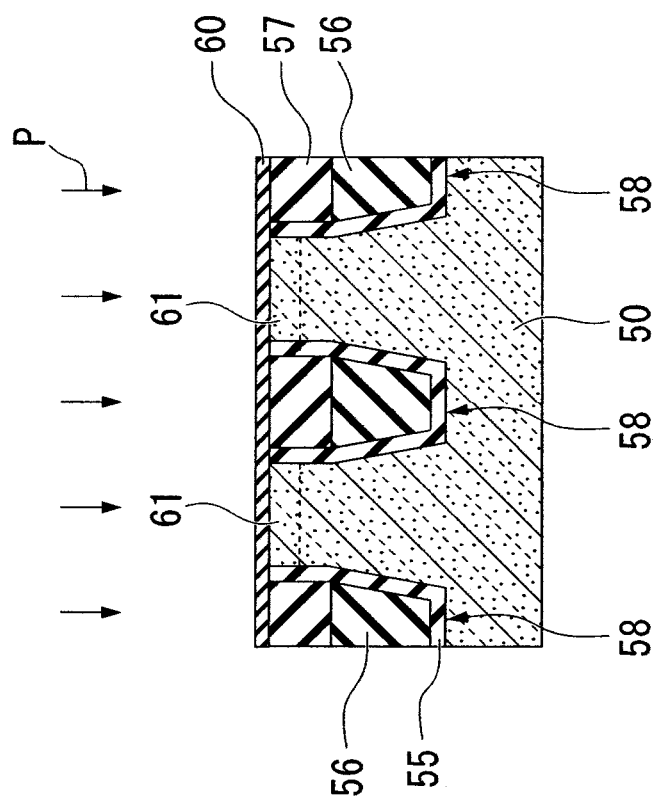

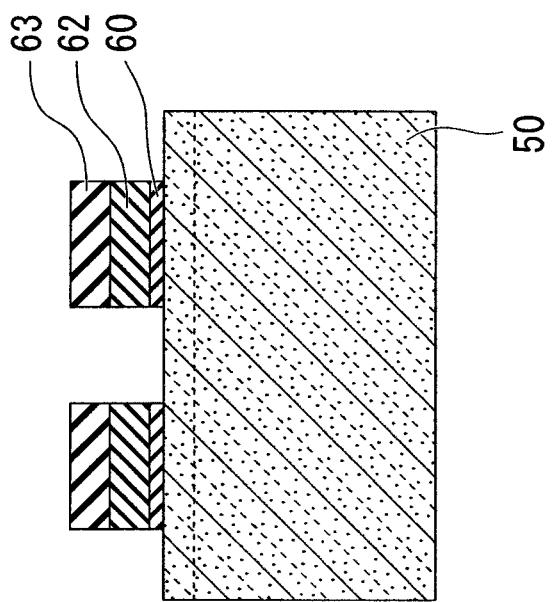
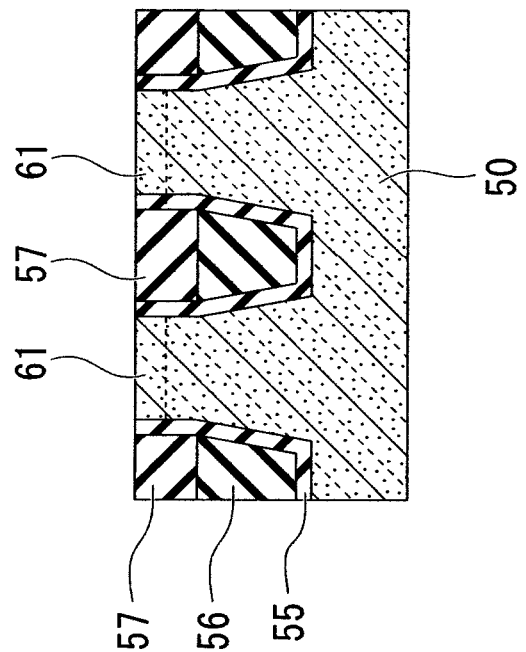

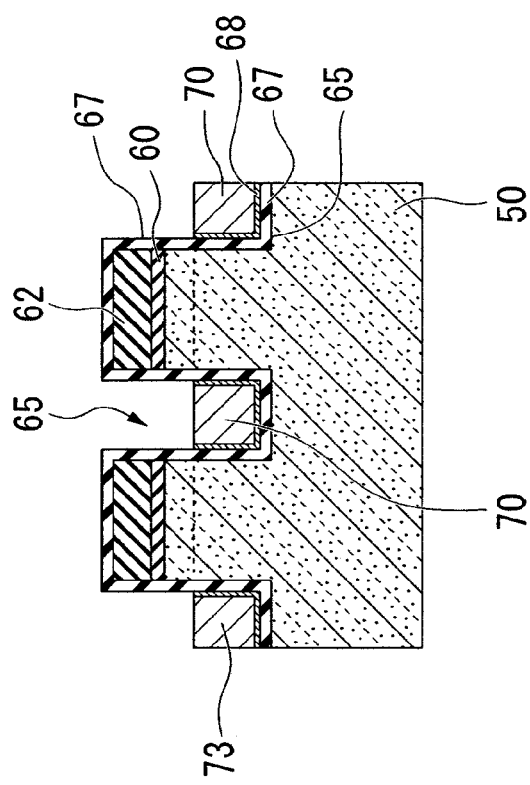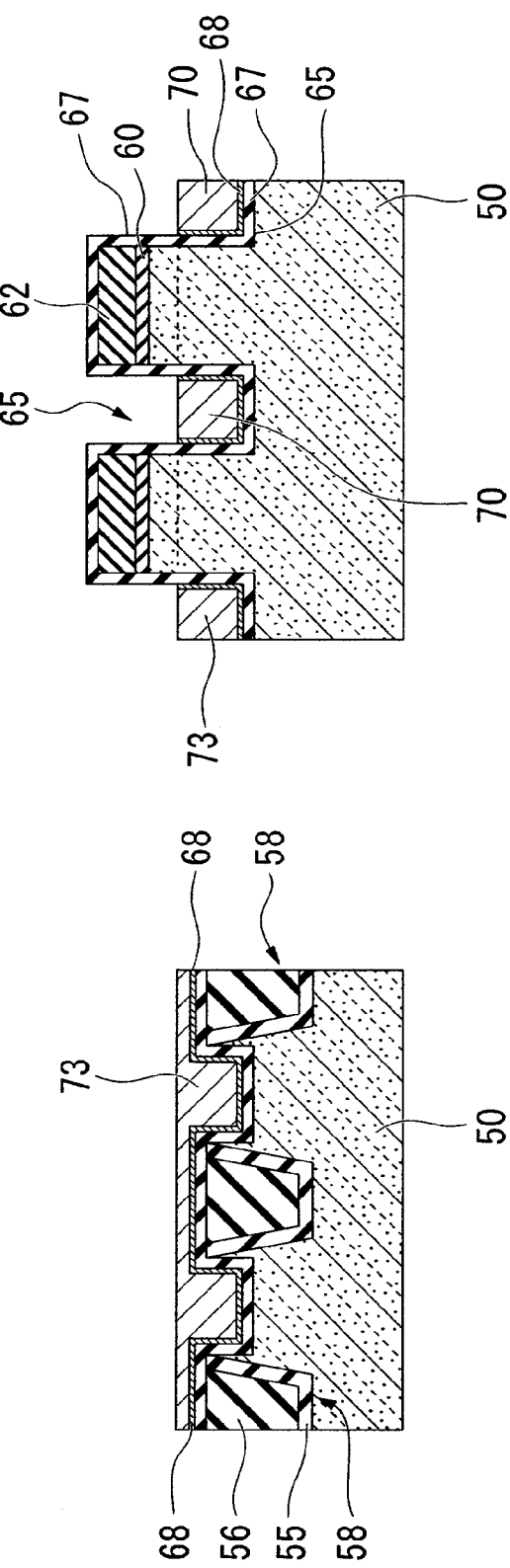

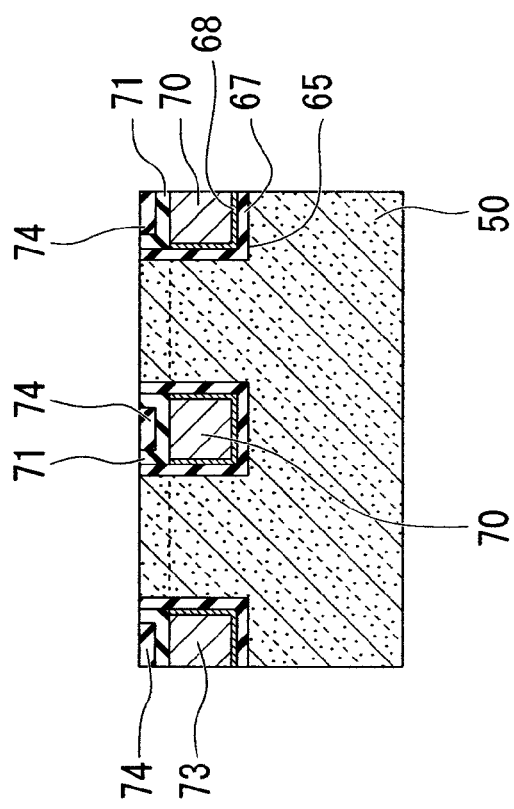
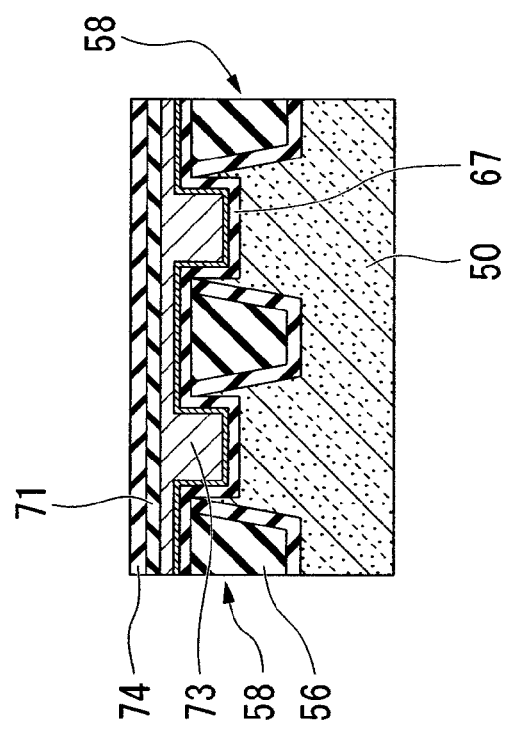
FIG. 12A
FIG. 12B

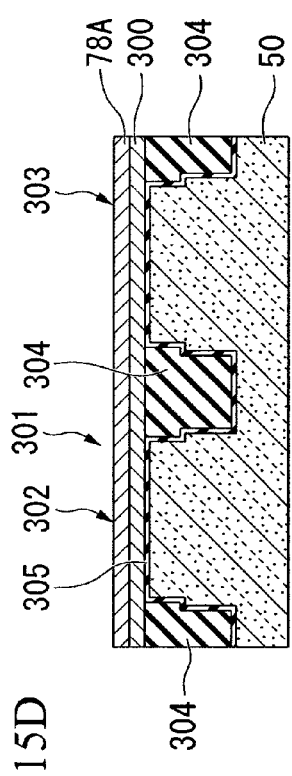
FIG. 15A
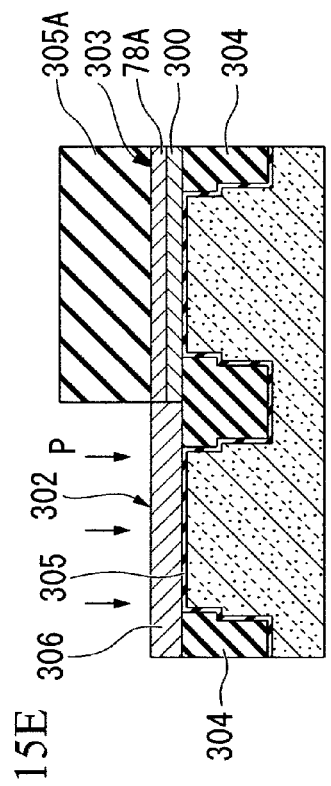
FIG. 15D
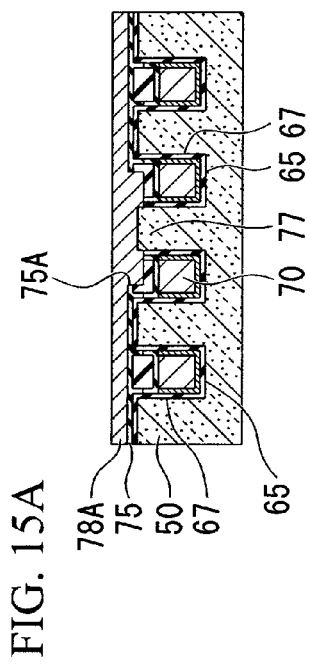
FIG. 15B
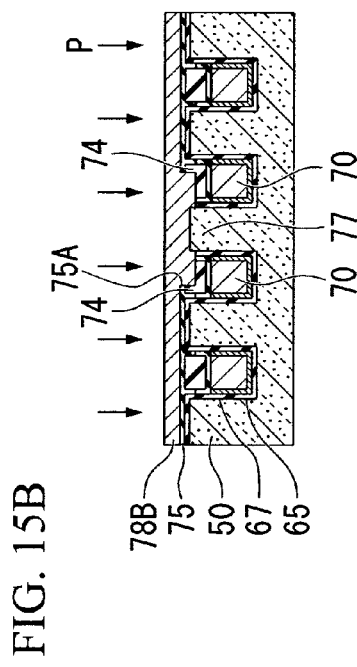
FIG. 15E
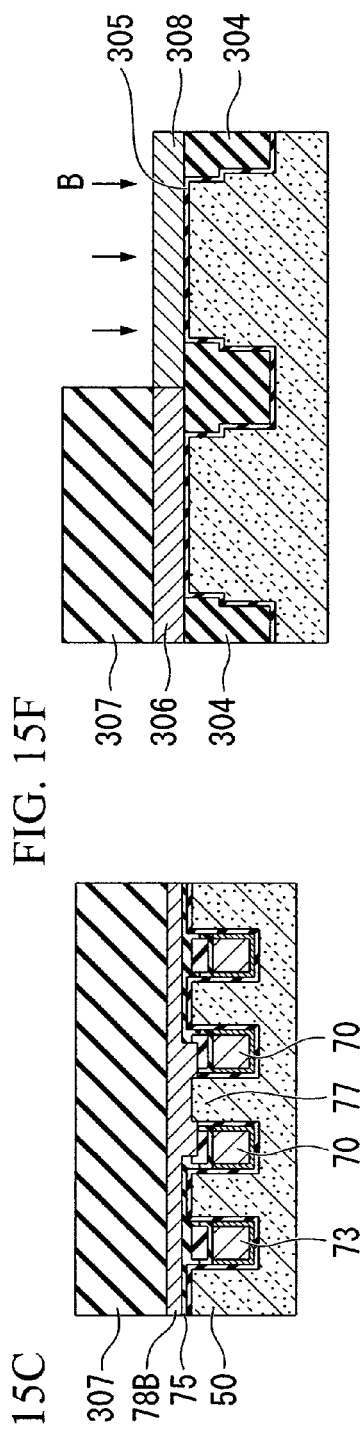
FIG. 15C
FIG. 15F

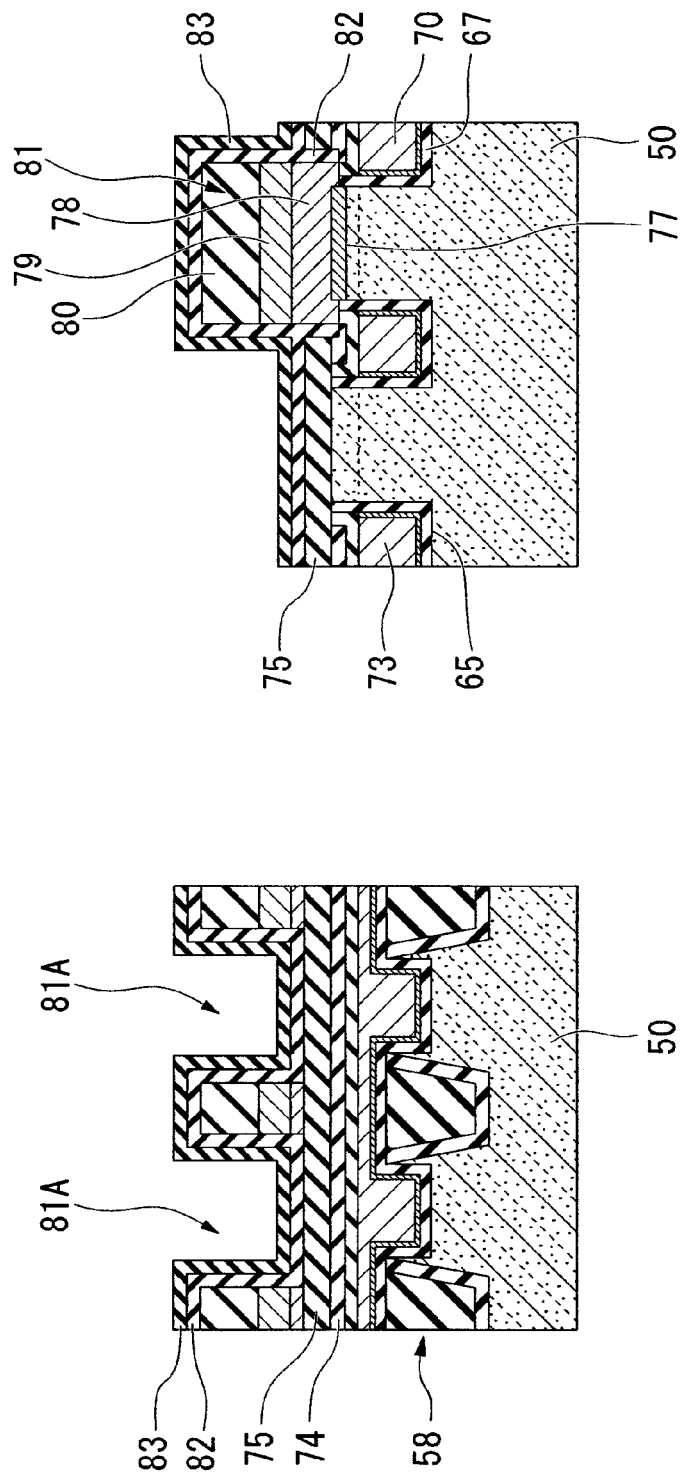

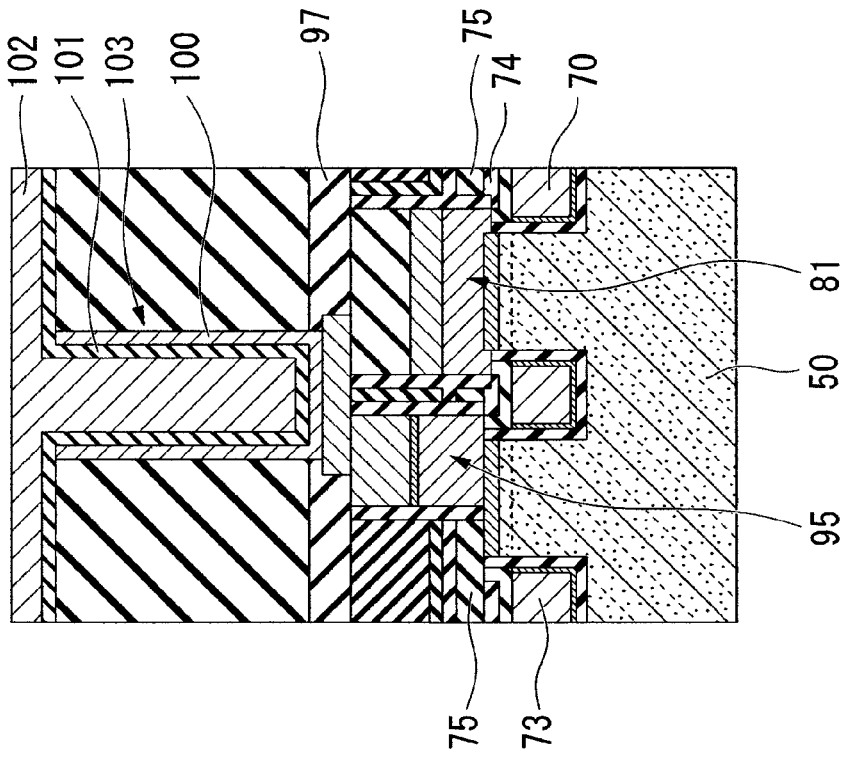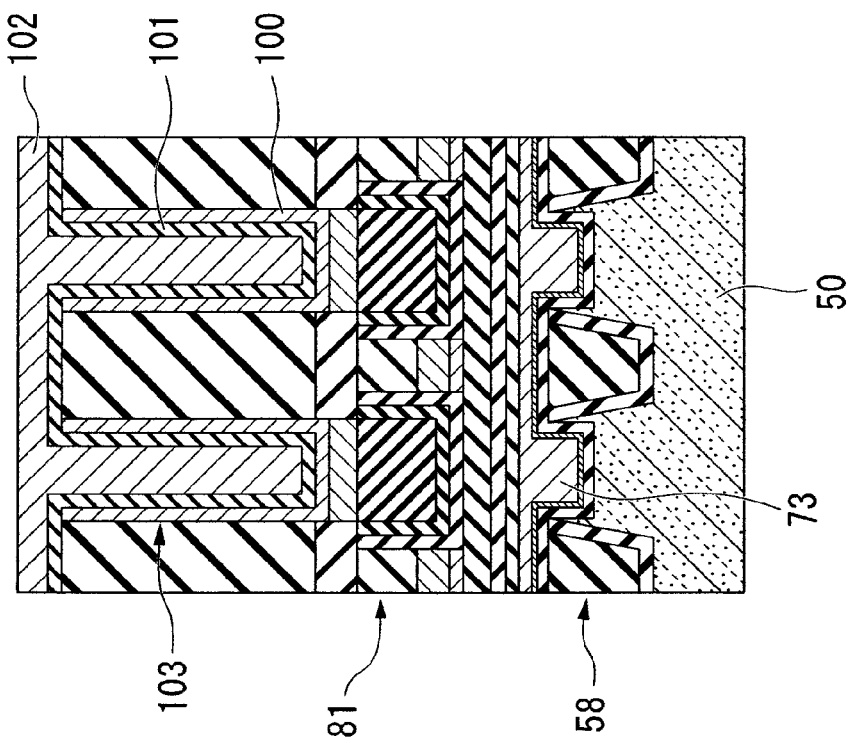

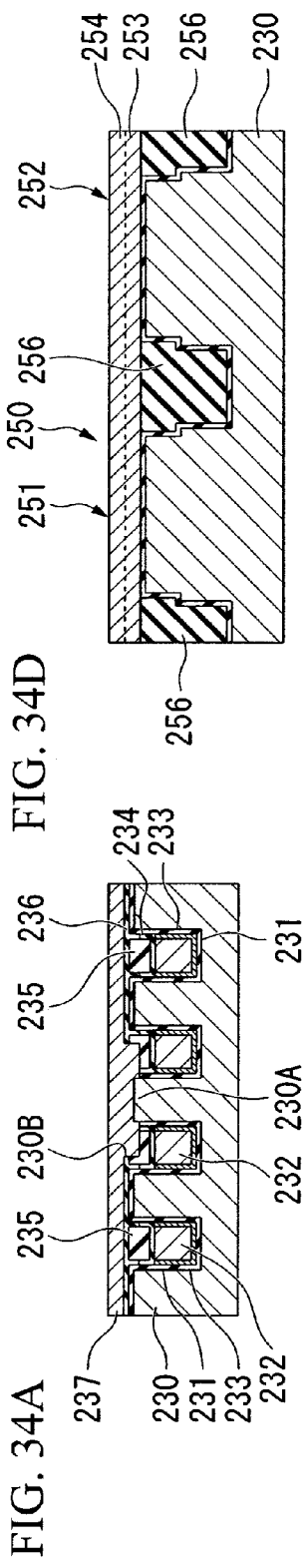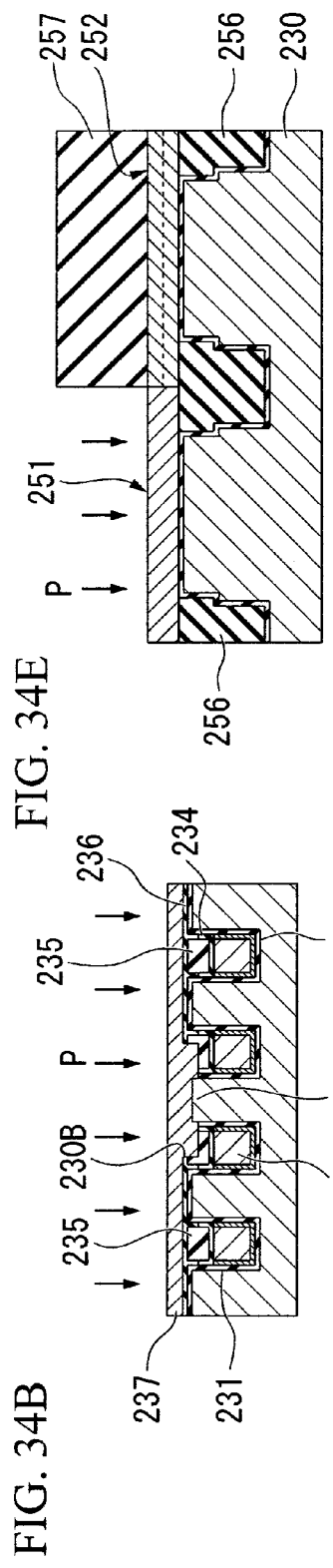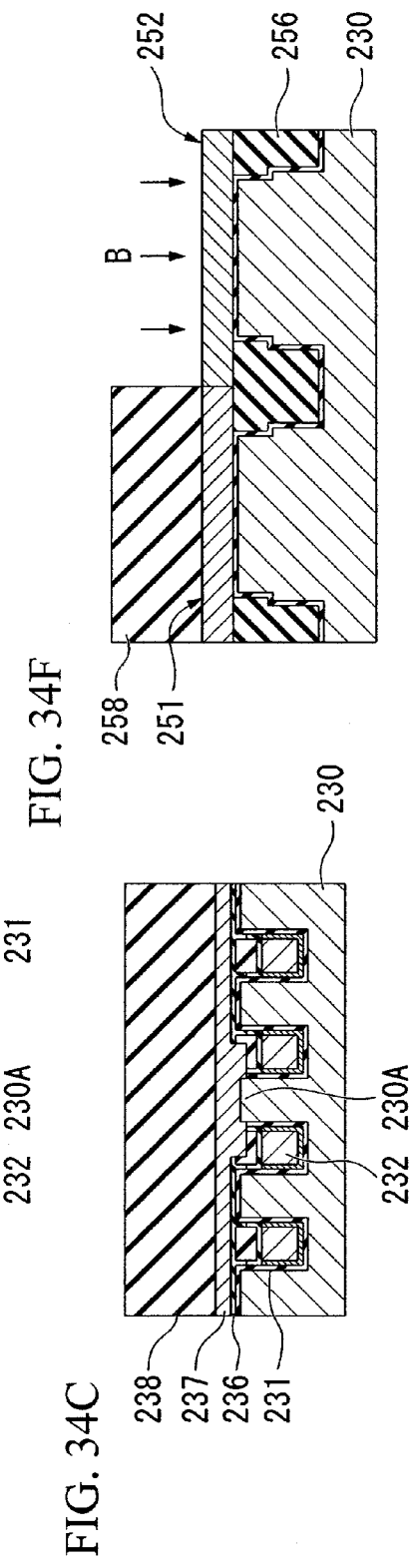

US 8,648,415 B2

SEMICONDUCTOR DEVICE WITH IMPURITY REGION WITH INCREASED CONTACT AREA

BACKGROUND OF THE INVENTION

1. Field of the Invention

The present invention relates to a semiconductor device and a method of fabricating the same.

Priority is claimed on Japanese Patent Application No. 2009-288045, Dec. 18, 2009, the content of which is incorporated herein by reference.

2. Description of the Related Art

In recent years, the miniaturization of dynamic random access memory (DRAM) cells has necessitated a reduction in gate length of an access transistor (hereinafter, referred to as a "cell transistor") of a cell array. However, as the gate length of the cell transistor decreases, a short channel effect of the cell transistor increases. Thus, the threshold voltage Vt of the cell transistor is reduced due to an increase in subthreshold current. Also, when the concentration of a substrate is increased to suppress a drop in threshold voltage Vt, junction leakage increases. As a result, deterioration of refresh characteristics of a DRAM may occur.

Japanese Unexamined Patent Application, First Publications, Nos. JP-A-2006-339476 and JP-A-2007-081095 disclose a trench-gate transistor (also referred to as a "recess channel transistor") in which a gate electrode is buried in a trench formed in a silicon substrate. Since it is possible to sufficiently ensure an effective channel length, which is a gate length, of the trench-gate transistor, even a fine DRAM with a minimum processing dimension of about 60 nm or less may be realized.

SUMMARY

In one embodiment, a semiconductor device may include, but is not limited to, a semiconductor substrate, an impurity region in the semiconductor substrate, and a conductive layer contacting a top surface of the impurity region and at least a side surface of the impurity region.

In another embodiment, a semiconductor device may include, but is not limited to, a semiconductor substrate having a groove, an impurity region in the groove, and a conductive layer in contact with the impurity region. A bottom of the groove is lower than a top of the impurity region. The bottom of the groove is adjacent to the side surface of the impurity region.

In still another embodiment, a semiconductor device may include, but is not limited to, a semiconductor substrate having a groove and a conductive layer in the groove. A bottom of a first portion of the groove is higher than a bottom of a second portion of the groove. A portion of the semiconductor substrate under the first portion includes an impurity. The conductive layer covers the portion of the semiconductor substrate under the first portion and at least a portion of the semiconductor substrate under the second portion.

BRIEF DESCRIPTION OF THE DRAWINGS

The above features and advantages of the present invention will be more apparent from the following description of certain preferred embodiments taken in conjunction with the accompanying drawings, in which:

FIG. 2A is a fragmentary cross sectional elevation view, taken along an A-A' line of FIG. 1, illustrating a memory cell in the semiconductor device of FIG. 1;

FIG. 2B is a fragmentary cross sectional elevation view, taken along a B-B' line of FIG. 1, illustrating a memory cell in the semiconductor device of FIG. 1;

FIG. 6A is a fragmentary cross sectional elevation view, taken along an A-A' line of FIG. 1, illustrating a memory cell in a step, subsequent to the step of FIGS. 5A and 5B, involved in the method of forming the semiconductor device of FIGS. 1, 2A and 2B;

FIG. 6B is a fragmentary cross sectional elevation view, taken along a B-B' line of FIG. 1, illustrating a memory cell in a step, subsequent to the step of FIGS. 5A and 5B, involved in the method of forming the semiconductor device of FIGS. 1, 2A and 2B;

FIG. 7A is a fragmentary cross sectional elevation view, taken along an A-A' line of FIG. 1, illustrating a memory cell in a step, subsequent to the step of FIGS. 6A and 6B, involved in the method of forming the semiconductor device of FIGS. 1, 2A and 2B;

FIG. 7B is a fragmentary cross sectional elevation view, taken along a B-B' line of FIG. 1, illustrating a memory cell in a step, subsequent to the step of FIGS. 6A and 6B, involved in the method of forming the semiconductor device of FIGS. 1, 2A and 2B;

FIG. 10A is a fragmentary cross sectional elevation view, taken along an A-A' line of FIG. 1, illustrating a memory cell in a step, subsequent to the step of FIGS. 9A and 9B, involved in the method of forming the semiconductor device of FIGS. 1, 2A and 2B;

FIG. 10B is a fragmentary cross sectional elevation view, taken along a B-B' line of FIG. 1, illustrating a memory cell in a step, subsequent to the step of FIGS. 9A and 9B, involved in the method of forming the semiconductor device of FIGS. 1, 2A and 2B;

FIG. 12A is a fragmentary cross sectional elevation view, taken along an A-A' line of FIG. 1, illustrating a memory cell in a step, subsequent to the step of FIGS. 11A and 11B, involved in the method of forming the semiconductor device of FIGS. 1, 2A and 2B;

FIG. 12B is a fragmentary cross sectional elevation view, taken along a B-B' line of FIG. 1, illustrating a memory cell in a step, subsequent to the step of FIGS. 11A and 11B, involved in the method of forming the semiconductor device of FIGS. 1, 2A and 2B;

FIG. 15A is a fragmentary cross sectional elevation view, illustrating a memory cell in a step, subsequent to the step of FIGS. 14A and 14B involved in the method of forming the semiconductor device of FIGS. 1, 2A and 2B;

FIG. 15B is a fragmentary cross sectional elevation view, illustrating a memory cell in a step, subsequent to the step of FIG. 15A involved in the method of forming the semiconductor device of FIGS. 1, 2A and 2B;

FIG. 15C is a fragmentary cross sectional elevation view, illustrating a memory cell in a step, subsequent to the step of FIG. 15B, involved in the method of forming the semiconductor device of FIGS. 1, 2A and 2B;

FIG. 15D is a fragmentary cross sectional elevation view, illustrating a memory cell in a step, subsequent to the step of FIGS. 14A and 14B, involved in the method of forming the semiconductor device of FIGS. 1, 2A and 2B;

FIG. 15E is a fragmentary cross sectional elevation view, illustrating a memory cell in a step, subsequent to the step of FIG. 15D, involved in the method of forming the semiconductor device of FIGS. 1, 2A and 2B;

FIG. 15F is a fragmentary cross sectional elevation view, illustrating a memory cell in a step, subsequent to the step of FIG. 15E, involved in the method of forming the semiconductor device of FIGS. 1, 2A and 2B;

FIG. 20A is a fragmentary cross sectional elevation view, taken along an A-A' line of FIG. 1, illustrating a memory cell in a step, subsequent to the step of FIGS. 16A and 16B, involved in the method of forming the semiconductor device of FIGS. 1, 2A and 2B;

FIG. 20B is a fragmentary cross sectional elevation view, taken along a B-B' line of FIG. 1, illustrating a memory cell in a step, subsequent to the step of FIGS. 16A and 16B, subsequent to the step of FIGS. 19A and 19B, involved in the method of forming the semiconductor device of FIGS. 1, 2A and 2B;

FIG. 27A is a fragmentary cross sectional elevation view, taken along an A-A' line of FIG. 1, illustrating a memory cell in a step, subsequent to the step of FIGS. 26A and 26B, involved in the method of forming the semiconductor device of FIGS. 1, 2A and 2B;

FIG. 27B is a fragmentary cross sectional elevation view, taken along a B-B' line of FIG. 1, illustrating a memory cell in a step, subsequent to the step of FIGS. 26A and 26B, involved in the method of forming the semiconductor device of FIGS. 1, 2A and 2B;

FIG. 34A is a fragmentary cross sectional elevation view, illustrating a memory cell in a step, subsequent to the step of FIGS. 26A and 26B, involved in the method of forming the semiconductor device of FIGS. 1, 2A and 2B;

FIG. 34B is a fragmentary cross sectional elevation view, illustrating a memory cell in a step, subsequent to the step of FIGS. 26A and 26B, involved in the method of forming the semiconductor device of FIGS. 1, 2A and 2B;

FIG. 34C is a fragmentary cross sectional elevation view, illustrating a memory cell in a step, subsequent to the step of FIGS. 26A and 26B, involved in the method of forming the semiconductor device of FIGS. 1, 2A and 2B;

FIG. 34D is a fragmentary cross sectional elevation view, illustrating a memory cell in a step, subsequent to the step of FIGS. 26A and 26B, involved in the method of forming the semiconductor device of FIGS. 1, 2A and 2B;

FIG. 34E is a fragmentary cross sectional elevation view, illustrating a memory cell in a step, subsequent to the step of FIGS. 26A and 26B, involved in the method of forming the semiconductor device of FIGS. 1, 2A and 2B; and FIG. 34F is a fragmentary cross sectional elevation view, illustrating a memory cell in a step, subsequent to the step of FIGS. 26A and 26B, involved in the method of forming the semiconductor device of FIGS. 1, 2A and 2B.

DETAILED DESCRIPTION OF THE PREFERRED EMBODIMENTS

Before describing the present invention, the related art will be explained in detail with reference to drawings, in order to facilitate the understanding of the present invention.

Figure 33:
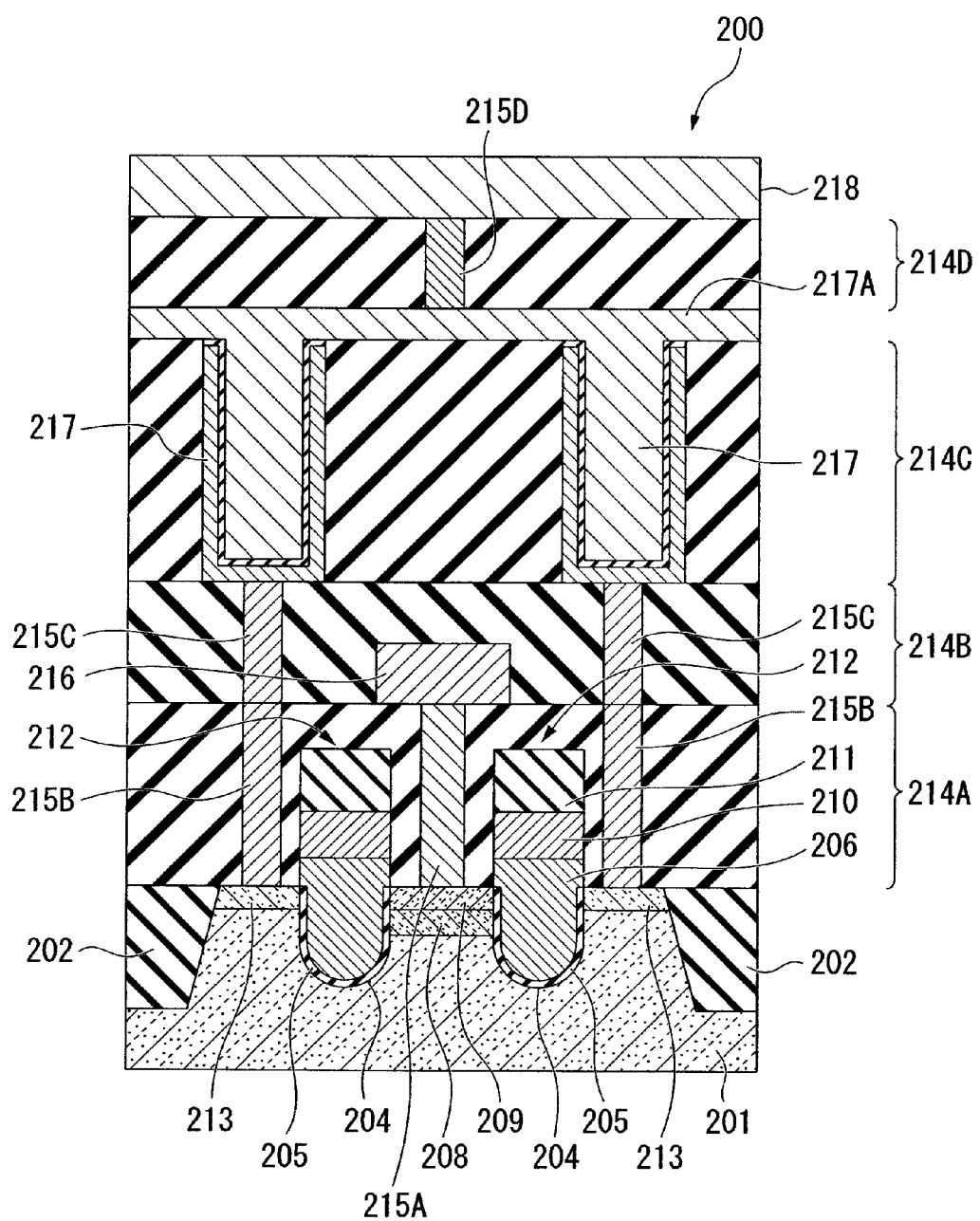
FIG. 33 is a fragmentary cross sectional elevation view illustrating a memory cell including a semiconductor device in accordance with a related art of the present invention.

FIG. 33 is a schematic cross-sectional view showing an example of a structure of a DRAM including a trench-gate cell transistor. In a DRAM 200 having the structure shown in FIG. 33, element isolation regions 202 are formed in a surface of a P-type silicon substrate 201 and spaced apart from each other from side to side. Gate trenches 204 are formed in a region of the semiconductor substrate 201 interposed between the element isolation regions 202 and spaced apart from each other in a lateral direction of FIG. 33. Gate electrodes 212 are formed to fill the gate trenches 204 through a gate insulating layer 205 formed on inner walls of the gate trenches 204 between the gate electrodes 212 and the gate trenches 204.

The gate electrodes 212 fill the gate trenches 204 and simultaneously protrude upward from the silicon substrate 201. In the above-described structure, each of the gate electrodes 212 has a triple structure obtained by sequentially stacking a polysilicon (poly-Si) layer 206, a metal layer 210 having a high-melting point, and a gate cap insulating layer 211. Portions protruding from the gate trenches 204 are covered by a first interlayer insulating layer 214A formed on the semiconductor substrate 201.

A high-concentration P-type diffusion layer 208 and a high-concentration N-type diffusion layer 209 are stacked on the surface of the silicon substrate 201 between the gate electrodes 212 shown in FIG. 33, while low-concentration N-type diffusion layers 213 are simultaneously formed in regions outside the gate electrodes 212. A contact plug 215A, which is a bit line contact, functioning as a vertical electrical conduction path is formed in the first interlayer insulating layer 214A formed over the high-concentration N-type diffusion layer 209. Contact plugs 215B functioning as vertical electrical conduction paths are formed in the first interlayer insulating layer 214A formed over the low-concentration N-type diffusion layers 213.

Next, a second interlayer insulating layer 214B is formed over the first interlayer insulating layer 214A. A bit line 216 is formed in the second interlayer insulating layer 214B formed over the contact plug 215A, and second contact plugs 215C functioning as vertical electrical conduction paths are simultaneously formed in the second interlayer insulating layer 214B formed over the contact plugs 215B.

Furthermore, a third interlayer insulating layer 214C is formed over the second interlayer insulating layer 214B. Cell capacitors 217 are formed in the third interlayer insulating layer 214 formed on the second contact plugs 215C. A fourth interlayer insulating layer 214D is formed over the third interlayer insulating layer 214C. Upper electrodes 217A of the cell capacitors 217 are connected to an upper interconnection 218 via a third contact plug 215D formed in the fourth interlayer insulating layer 214D. Thus, the DRAM 200 having the schematic structure shown in FIG. 33 is constructed.

In the structure of the DRAM 200 including the trench-gate cell transistor shown in FIG. 33, since the gate electrodes 212 are configured to protrude upward from the silicon substrate 201 to the first interlayer insulating layer 214A, the contact plug 215A, which is a bit line contact, should be necessarily formed between gate lines connected to the gate electrodes 212. However, since the interval between the gate lines is extremely small, processing of the contact plug 215A is difficult.

In order to avoid the above-described problems in the trench-gate cell transistor, the present inventor consider it possible to adopt a buried structure shown in FIGS. 34A through 34F.

In the buried structure shown in FIGS. 34A through 34F, a plurality of trenches 231 are formed at predetermined intervals in a lateral direction of FIG. 34A in a surface of a semiconductor substrate 230 as shown in FIG. 34A. A gate electrode 232 is buried in each of the trenches 231 with a gate insulating layer 233 interposed therebetween, and a buried insulating layer 235 is buried over the gate electrode 232 with a liner layer 234 interposed therebetween. Also, referring to FIG. 34A, an impurity diffusion layer 230A is formed using an ion implantation process in a portion of the surface of the semiconductor substrate 230 between the trenches 231 disposed adjacent to each other in a lateral direction.

To form a gate electrode in the buried structure, an interlayer insulating layer 236 is stacked on the semiconductor substrate 230, and a contact hole 230B is formed using photolithography and etching techniques to be connected to the impurity diffusion layer 230A. Thereafter, a polysilicon layer 237 is formed and then patterned using photolithography and etching techniques in the shape of a bit line containing a gate electrode so that a bit line containing a desired gate electrode can be formed. Also, at this time, before the patterning process, an impurity ion, such as phosphorus (P), may be introduced into the polysilicon layer 237 as shown in FIG. 34B.

Furthermore, according to processes shown in FIGS. 34A through 34C, in consideration of a transistor structure that will be formed in a peripheral circuit region of the DRAM, non-doped polysilicon layers 253 and 254 may be stacked in a first forming region 251 and a second forming region 252 shown in FIG. 34D. The first formation region 251 is an NMOS transistor forming region or the like in a peripheral circuit region 250 of the semiconductor substrate 230. The second formation region 252 is a PMOS transistor forming region or the like in a peripheral circuit region 250 of the semiconductor substrate 230. Thus, an NMOS transistor or a PMOS transistor may be formed over an element isolation region 256. In this case, as shown in FIG. 34E, the second forming region 252 may be covered by a photoresist layer 257 and an N-type impurity ion, such as phosphorus (P), may be introduced into the first forming region 251. Next, as shown in FIG. 34F, the first forming region 251 may be covered by a photoresist layer 258, and a P-type impurity ion, such as boron (B) ion, may be introduced into the second forming region 252. Thus, the NMOS transistor and the PMOS transistor are normally formed in a peripheral-transistor forming region.

However, even if phosphorus is introduced into the polysilicon layer 237 to be currently applied, since the polysilicon layer 237 has a low phosphorus concentration, it is impossible to reduce a contact resistance between a bit line formed by the polysilicon layer 237 and the impurity diffusion layer 230A of the semiconductor substrate 230.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, a semiconductor substrate, an impurity region in the semiconductor substrate, and a conductive layer contacting a top surface of the impurity region and at least a side surface of the impurity region.

In some cases, the semiconductor device may include, but is not limited to, the conductive layer including a side contact portion contacting the side surface of the impurity region. The side contact portion is lower than the top surface of the impurity region.

In some cases, the semiconductor device may further include, but is not limited to, the conductive layer including a lower layer of a doped polysilicon.

In some cases, the semiconductor device may further includes include, but is not limited to, a metal layer over the conductive layer.

In some cases, the semiconductor device may include, but is not limited to, the conductive layer being a wiring layer. The impurity region is one of a source region and a drain region of a transistor.

In some cases, the semiconductor device may further include, but is not limited to, a pair of oxide layers. The impurity region is interposed between the pair of oxide layers.

In another embodiment, a semiconductor device may include, but is not limited to, a semiconductor substrate having a groove, an impurity region in the groove, and a conductive layer in contact with the impurity region. A bottom of the groove is lower than a top of the impurity region. The bottom of the groove is adjacent to the side surface of the impurity region.

In some cases, the semiconductor device may further include, but is not limited to, the conductive layer including a side contact portion contacting the side surface of the impurity region. The side contact portion is lower than the top surface of the impurity region.

In some cases, the semiconductor device may include, but is not limited to, the conductive layer including a lower layer of a doped polysilicon.

In some cases, the semiconductor device may further include, but is not limited to, a metal layer over the conductive layer.

In some cases, the semiconductor device may include, but is not limited to, the conductive layer being a wiring layer. The impurity region is one of a source region and a drain region of a transistor.

In some cases, the semiconductor device may further include, but is not limited to, a pair of oxide layers. The impurity region is interposed between the pair of oxide layers.

In some cases, the semiconductor device may include, but is not limited to, the conductive layer contacting the bottom of the groove.

In still another embodiment, a semiconductor device may include, but is not limited to, a semiconductor substrate having a groove and a conductive layer in the groove. A bottom of a first portion of the groove is higher than a bottom of a second portion of the groove. A portion of the semiconductor substrate under the first portion includes an impurity. The conductive layer covers the portion of the semiconductor substrate under the first portion and at least a portion of the semiconductor substrate under the second portion.

In some cases, the semiconductor device may further include, but is not limited to, the conductive layer including a side contact portion contacting the side surface of the impurity region. The side contact portion is lower than the top surface of the impurity region.

In some cases, the semiconductor device may include, but is not limited to, the conductive layer including a lower layer of a doped polysilicon.

In some cases, the semiconductor device may further include, but is not limited to, a metal layer over the conductive layer.

In some cases, the semiconductor device may include, but is not limited to, the conductive layer being a wiring layer. The impurity region is one of a source region and a drain region of a transistor.

In some cases, the semiconductor device may further include, but is not limited to, a pair of oxide layers. The impurity region is interposed between the pair of oxide layers.

In some cases, the semiconductor device may include, but is not limited to, the conductive layer contacting the bottom of the groove.

In still another embodiment, a method for forming a semiconductor device may include, but is not limited to, the following processes. An insulating layer is formed over a semiconductor substrate. A groove in the insulating layer is formed to expose a portion of the semiconductor substrate. A first impurity is introduced into the portion of the semiconductor substrate. A polysilicon layer which may include a second impurity is formed, the polysilicon layer contacting the portion of the semiconductor substrate. The second impurity is introduced into the polysilicon layer. The polysilicon layer is patterned to form a wiring connected to the portion of the semiconductor substrate.

In some cases, the method for forming a semiconductor device may include, but is not limited to, the following processes. The portion of the semiconductor substrate has a first portion and the second portion below the first portion. The first impurity is introduced into the first portion at a high concentration. The first impurity is introduced into the second portion at a low concentration.

In some cases, the method for forming the semiconductor device may include, but is not limited to, the following processes. The wiring is formed by laminating the polysilicon layer and a metal layer.

In still another embodiment, a method for forming a semiconductor device may include, but is not limited to, the following processes. A semiconductor substrate which includes a cell transistor region and a peripheral circuit region is prepared. An insulating film is formed over the cell transistor region. A groove is formed in the insulating layer to expose a portion of the semiconductor substrate in the cell transistor region. First impurity is introduced into the portion of the semiconductor substrate in the cell transistor region. A first polysilicon layer is formed in the peripheral circuit region. A second polysilicon layer which may include second impurity is formed in the cell transistor region and the peripheral circuit region, the polysilicon layer contacting the portion of the semiconductor substrate. The second impurity is introduced into the second polysilicon layer. The second polysilicon layer in the cell transistor region is patterned to form a wiring connected to the portion of the semiconductor substrate. The second polysilicon layer in the peripheral circuit region is patterned to form a gate electrode of a transistor.

Hereinafter, in one embodiment, a DRAM (Dynamic Random Access Memory) as the semiconductor device will be described. In the drawings used for the following description, to facilitate understanding of the embodiments, illustrations are partially enlarged and shown, and the sizes and ratios of constituent elements are not limited to being the same as the actual dimensions. Materials, sizes, and the like exemplified in the following description are just examples, and the invention is not limited thereto and may be appropriately modified within the scope which does not deviate from the embodiments.

<Structure of Semiconductor Memory Device>

Figure 1:
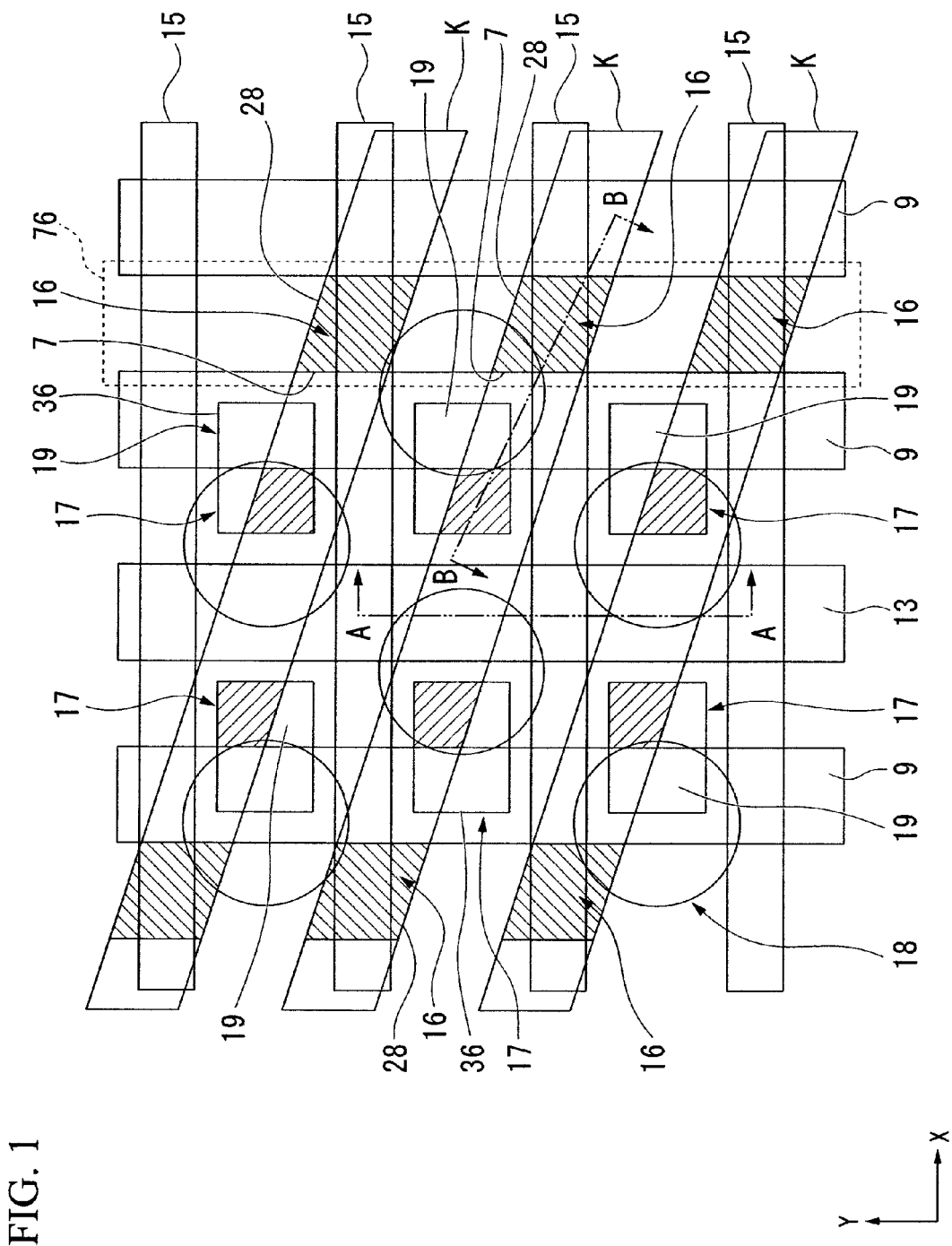
FIG. 1 is a fragmentary plan view illustrating a memory cell including a semiconductor device in accordance with one embodiment of the present invention.

FIG. 1 is a plan view of some elements of a cell structure of a semiconductor memory device. FIGS. 2A and 2B are partial cross-sectional views of the semiconductor memory device. FIG. 2A is a cross-sectional view taken along line A-A' of FIG. 1, and FIG. 2B is a cross-sectional view taken along line B-B' of FIG. 1.

A semiconductor memory device 1 of an embodiment of the present invention has a cell-transistor forming region 2 and a cell-capacitor forming region 3 shown in the cross-sectional views of FIGS. 2A and 2B. A semiconductor substrate 5 may be a conductive silicon substrate.

In the cell-transistor forming region 2, a plurality of strip-shaped active regions K are formed in one surface of the semiconductor substrate 5 in a direction inclined at a predetermined angle with respect to an X direction of FIG. 1, that is, in a direction inclined in a lateral direction of FIG. 1, and spaced by a predetermined distance apart from one another in a Y direction. In addition, to define the active regions K, a plurality of element isolation trenches 4 having a sectional shape shown in FIG. 2A are formed in a direction inclined at a predetermined angle with the X direction of FIG. 1. The plurality of element isolation trenches 4 are spaced by a predetermined distance apart from one another in the Y direction of FIGS. 1 and 2A. As shown in FIG. 2A, an inner insulating layer 4A may include a silicon oxide layer on inner surfaces of the element isolation trenches 4. An element isolation insulating layer 6 may include a silicon nitride layer inside the inner insulating layer 4A to fill the element isolation trenches 4, thereby forming element isolation regions (shallow trench isolation (STI) regions).

Furthermore, although the arrangement of the active regions K in a planar shape as shown in FIG. 1 is unique to the one embodiment of the present invention, the shape and alignment direction of the active regions K may not be particularly limited. The shape of the active regions K shown in FIG. 1 may naturally be the shape of active regions applied to other typical transistors and is not limited to the shape of the one embodiment of the present invention.

Also, as shown in FIG. 2B, a plurality of gate-electrode trenches 7 extend in the Y direction of FIG. 1 and are spaced a predetermined distance apart from each other in the X direction of FIGS. 1 and 2B. A gate insulating layer 7A may include a silicon oxide layer on inner surfaces of the gate-electrode trenches 7. A buried word line 9 may include a metal having a high melting point, such as tungsten (W), inside the gate insulating layer 7A with an inner surface layer 8 which may include titanium nitride interposed therebetween. A buried insulating layer 11 is formed over the buried word line 9 to fill the gate-electrode trenches 7 with a liner layer 10 interposed therebetween.

In FIG. 1, the gate-electrode trenches 7 in which the buried word lines 9 are formed include two kinds of trenches. One of trenches is formed as a channel of a trench-gate transistor in a portion overlapping the active region K. The other of trenches is formed as a trench formed in the STI region adjacent to the active region K to a smaller depth than the trench formed in the active region K. The buried word line 9 is formed as a single continuous interconnection with a planar top surface to fill two kinds of trenches with different depths.

Furthermore, in the one embodiment of the present invention, the gate insulating layer 7A and the liner layer 10 are formed such that top end edges of the gate insulating layer 7A and the liner layer 10 reach openings of the gate-electrode trenches 7. The buried insulating layer 11 is formed to fill a convex portion of the liner layer 10 formed in an opening of the gate insulating layer 7A. Thus, the buried insulating layer 11, the gate insulating layer 7A, and the liner layer 10 are stacked such that a top surface of the buried insulating layer 1, a top end edge of the gate insulating layer 7A, and a top end edge of the liner layer 10 substantially form one plane.

In the one embodiment of the present invention, the buried insulating layer 11 may be a solid layer obtained by coating a silicon oxide layer or a spin-on-dielectrics (SOD), which is an insulating coating layer which may include polysilazane, using a chemical vapor deposition (CVD) method and annealing the coated layer at a high temperature in a moisture-containing atmosphere.

As shown in FIG. 2A, a channel trench 12 is formed to a smaller depth than the element isolation trench 4 in a region between the element isolation trenches 4 adjacent to each other in the Y direction. The gate insulating layer 7A may include a silicon oxide layer over inner surfaces of the channel trench 12 and top surface of the element isolation trench 4 disposed adjacent to the channel trench 12. An element isolation buried wiring 13 is formed over the gate insulating layer 7A with the inner surface layer 8 which may include titanium nitride interposed therebetween. The liner layer 10 and the buried insulating layer 11 are stacked on the buried wiring 13. The liner layer 10 and the buried insulating layer 11 shown in FIG. 2A are the same as the liner layer 10 and the buried insulating layer 11 formed over the buried word line 9 shown in FIG. 2B, which are fabricated during by the following method.

Also, the element isolation buried wiring 13 is formed while the buried word line 9 is formed. The element isolation buried wiring 13 functions to electrically isolate source and drain regions, that is, impurity diffusion regions formed on both sides of the element isolation buried line 13 shown in FIG. 1, which constitute respective adjacent transistors in an active region formed in a line shape. Conventionally, an active region is formed as an isolated pattern surrounded by a buried element isolation region formed using an insulating layer. Accordingly, source and drain regions cannot be formed in a desired shape in an end portion of the active region due to the resolution limit of a lithography process. However, the construction of the one embodiment of the present invention may avoid the above-described problem because an active region may be formed in a line-shaped pattern.

As shown in FIGS. 1 and 2B, a plurality of buried word lines 9 extend in the Y direction and are spaced apart from one another in the X direction. However, in the structure of the one embodiment of the present invention, as shown in FIG. 2B, two buried word lines 9 and one element isolation buried wiring 13 are alternately arranged in this order in the X direction.

Also, as shown in FIG. 1, a bit line 15, which will be described in detail later, is disposed in a direction perpendicular to a direction in which the buried word line 9 and the buried line 13 are arranged. Accordingly, the active regions K having a strip-type plane shape are formed in the surface of the semiconductor substrate 5 to be inclined at a predetermined angle with a direction in which each of the buried word wirings 9 and each of the bit lines 15 extend. Since the active regions K are formed in the surface of the semiconductor substrate 5, a bit line connection region 16 is defined in a portion of the active region K disposed below each of the bit lines 15. Also, when an interconnection structure is viewed from the plan view as shown in FIG. 1, a capacitor contact plug forming region 17 is defined in a portion where the active region K exists, in a region between the buried word line 9 and the element isolation buried wiring 13 adjacent to the buried word line 9 in the X direction and between the bit lines 15 and 15 adjacent to another bit line in the Y direction.

Accordingly, when the interconnection structures is viewed from the plan view, as shown in FIG. 1, the bit lines 15 are approximately orthogonal to the buried word line 9 and the element isolation buried line 13. Simultaneously, the strip-shaped active regions K are disposed at an angle with the bit lines 15. Bit line connection regions 16 are formed in portions of the active regions K corresponding to regions between adjacent buried word lines 9. The capacitor contact plug forming region 17 is defined in a region between the buried word line 9 and the element isolation region 13 and between adjacent bit lines 15. Also, a capacitor contact pad 18 that will be described later is formed in a zigzag pattern with respect to the capacitor contact plug forming region 17 in the Y direction of FIG. 1. Although the capacitor contact pads 18 are disposed in the X direction of FIG. 1 between the bit lines 15 adjacent to each other in the Y direction, the capacitor contact pads 18 are repetitively disposed zigzag in several positions in the Y direction. For example, the center of one capacitor contact pad 18 may be disposed over the buried word line 9 in the Y direction and the center of another capacitor contact pad 18 may be disposed over one side of the buried word line 9. In other words, the capacitor contact pads 18 are disposed zigzag in the Y direction.

Next, in the one embodiment of the present invention, the capacitor contact plug 19 formed in the capacitor contact plug forming region 17 is formed in a rectangular shape as shown in FIG. 1. However, a portion of the capacitor contact plug 19 is disposed on each of the buried word lines 9, while the remaining portion of the capacitor contact plug 19 is disposed to be located in a region between the adjacent bit lines 15 and over a region between the buried word line 9 and the element isolation buried line 13 so that each of the capacitor contact plugs 19 can be connected to a capacitor 47 that will be described later.

From the plan view of FIG. 1, the capacitor contact plug forming region 17 may cover a portion of the buried word line 9, a portion of the STI region, and a portion of the active region K. Accordingly, from the plan view, the capacitor contact plug 19 is formed to range over the portion of the buried word line 9, the portion of the STI region, and the portion of the active region K.

The cell-transistor forming region 2 will be described again with reference to FIGS. 2A and 2B. As shown in FIG. 2B, a low-concentration impurity diffusion layer 21 and a high-concentration impurity diffusion layer 22 are formed sequentially from a depth direction on the surface of the semiconductor substrate 5 located between the buried word lines 9 adjacent to each other in the X direction and in a region corresponding to the active region K. A low-concentration impurity diffusion layer 23 and a high-concentration impurity diffusion layer 24 are formed sequentially from the depth direction on the surface of the semiconductor substrate 5 located between the buried word line 9 and the element isolation buried wiring 13 adjacent in the X direction and in a region corresponding to the active region K.

Thus, a first interlayer insulating layer 26 is formed to cover the buried insulating layer 11 in the region shown in FIG. 2A. The first interlayer insulating layer 26 is formed over the semiconductor substrate 5 in the region shown in FIG. 2B. That is, the first interlayer insulating layer 26 is formed to cover the cover the high-concentration impurity diffusion layers 22 and 24 and the gate-electrode trench 7 in which the buried word line 9, the liner layer 10, and the buried insulating layer 11 are formed.

A contact hole 28 is formed in a region of the first interlayer insulating layer 26 between the gate-electrode trenches 7 adjacent to each other in the X direction of FIG. 2B. As shown in FIG. 1, the bit lines 15 are formed over the first interlayer insulating layer 26 and extend in a direction perpendicular to the buried word line 9. In this case, the bit lines 15 are disposed in portion of the contact hole 28, extend to lower portion of the contact hole 28. Further, the bit lines 15 are connected to the high-concentration impurity layer 22 formed under the respective contact holes 28. Accordingly, a portion including the bit line 15 of a region in which the contact hole 28 is formed, i.e., a region having the high-concentration impurity diffusion layer 22 therebeneath becomes the bit line connection region 16.

The bit line 15 has a triple structure including a lower conductive layer 30 which may include polysilicon, a metal layer 31 which may include a metal having a high melting point, such as tungsten (W), and an upper insulating layer 32 which may include silicon nitride. An insulating layer 33, such as a silicon nitride layer, and a liner layer 34 are respectively formed on both sides of a widthwise direction of the bit line 15 shown in FIG. 2B and on the first interlayer insulating layer 26 shown in FIG. 2A.

More specifically, as will be described in the following fabrication method, the lower conductive layer 30 is an introduced polysilicon layer formed by further implanting impurity ion, such as phosphorus (P) ion, into polysilicon doped with impurity, such as phosphorus ion. Also, side contact portions 30a are formed on both ends of the lower conductive layer 30 disposed on both sides of a widthwise direction of the bit line 15 and protrude in a depth direction of the semiconductor substrate 50. Since the side contact portions 30a are formed on both sides of the lower conductive layer 30, the bit line 30 is connected to the high-concentration impurity diffusion layer 22 of the semiconductor substrate 5 to surround the high-concentration impurity diffusion layer 22, thereby contributing to reducing a contact resistance.

A capacitor contact opening 36, which has a rectangular shape when viewed from a plan view, is formed in a region between the bit lines 15 adjacent to each other in the Y direction of FIG. 1. The capacitor contact opening 36 is over a region between an upper region of the buried word line 9 and the element isolation buried wiring 13 disposed adjacent thereto. A capacitor contact plug 19 is formed within the capacitor contact opening 36 and surrounded by sidewalls 37 which may include a silicon nitride layer. Accordingly, a portion where the capacitor contact opening 36 is formed corresponds to the capacitor contact plug forming region 17. As shown in FIG. 2B, the capacitor contact plug 19 has a triple layer structure including a lower conductive layer 40 which may include polysilicon, a silicide layer 41 which may include CoSi, and a metal layer 42 which may include W. Also, the bit line 15 and the capacitor contact plug 19 are formed on the semiconductor substrate 5 at the same level. Also, a buried insulating layer 43 is formed in the remaining region of the bit line 15 and the capacitor contact plug 19 at the same level as the bit line 15 and the capacitor contact plug 19.

Next, in the capacitor forming region 3 shown in FIGS. 2A and 2B, each of the capacitor contact pads 18 having a circular shape shown in FIG. 1 is formed to be zigzag with respect to the capacitor contact plug 19 to partially overlap the capacitor contact plug 19 from a plan view. Each of the capacitor contact pads 18 is covered by a stopper layer 45, while a third interlayer insulating layer 46 is simultaneously formed over the stopper 45. A capacitor 47 is formed over each of the capacitor contact pads 18 within the third interlayer insulating layer 46.

The capacitor 47 according to the one embodiment of the present invention includes a cup-type lower electrode 47A, a capacitor insulating layer 47B, an upper electrode 47C, a fourth interlayer insulating layer 48, an upper metal interconnection 49, and a protection layer 54. The cup-type lower electrode 47A is formed over the capacitor contact pad 18. The capacitor insulating layer 47B is formed to extend from the inside of the lower electrode 47A to the third interlayer insulating layer 46. The upper electrode 47C is formed to bury the inside of the lower electrode 47A within the capacitor insulating layer 47B and simultaneously extend to the top surface of the capacitor insulating layer 47B. The fourth interlayer insulating layer 48 is formed over the upper electrode 47. The upper metal interconnection 49 is formed over the fourth interlayer insulating layer 48. The protection layer 54 is formed to cover the upper metal interconnection 49 and the fourth interlayer insulating layer 48. In addition, the structure of the capacitor 47 formed in the capacitor forming region 3 is an example, and other typical capacitors (e.g., crown-type capacitors) applied to semiconductor memory devices may naturally be employed.

<Method of Fabricating Semiconductor Device>

Next, an example of a method of fabricating the semiconductor device shown in FIGS. 1, 2A, and 2B will be described with reference to FIGS. 3A through 23B. FIGS. 3A through 23A are cross-sectional views of portions taken along line A-A' of FIG. 1, and FIGS. 3B through 23B are cross-sectional views of portions taken along line B-B' of FIG. 1.

Figure 3B:
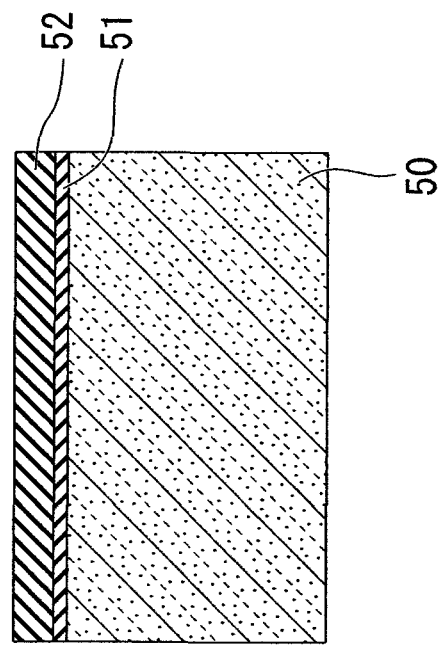
FIG. 3B is a fragmentary cross sectional elevation view, taken along a B-B' line of FIG. 1, illustrating a memory in a step involved in a method of forming the semiconductor device of FIGS. 1, 2A and 2B.
Figure 3A:
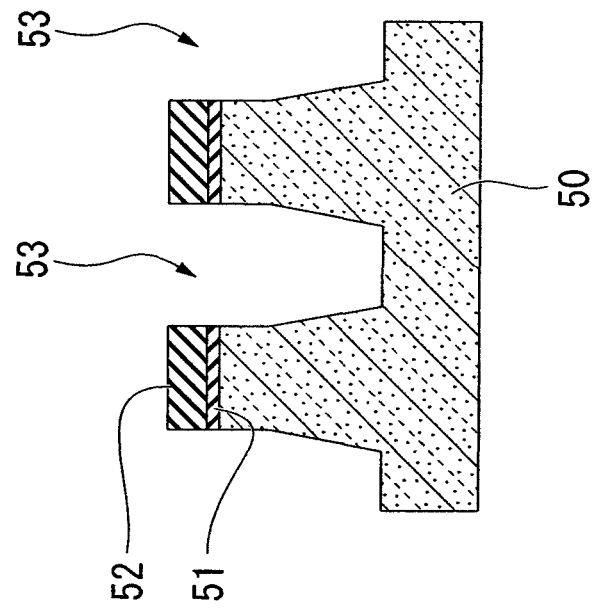
FIG. 3A is a fragmentary cross sectional elevation view, taken along an A-A' line of FIG. 1, illustrating a memory in a step involved in a method of forming the semiconductor device of FIGS. 1, 2A and 2B.

A semiconductor substrate 50, such as a P-type Si substrate, is prepared as shown in FIGS. 3A and 3B. A silicon oxide layer 51 and a silicon nitride ($Si_3N_4$) layer 54 serving as a mask are sequentially stacked. Also, a semiconductor substrate in which a P-well is previously formed using an ion implantation process in a region where a transistor is to be formed may be used as the semiconductor substrate 50.

Next, the silicon oxide layer 51, the silicon nitride layer 52, and the semiconductor substrate 50 are patterned using photolithography and dry etching techniques, thereby forming element isolation trench 53. The element isolation trench is formed in a surface of the silicon substrate 50 to define active regions K. From the plan view of the semiconductor substrate 50, the element isolation trench 53 is formed as a line-shaped pattern trench extending in a predetermined direction between both sides of the strip-shaped active region K of FIG. 1. A region corresponding to the active region K is covered by the silicon nitride layer 52.

Figure 4B:
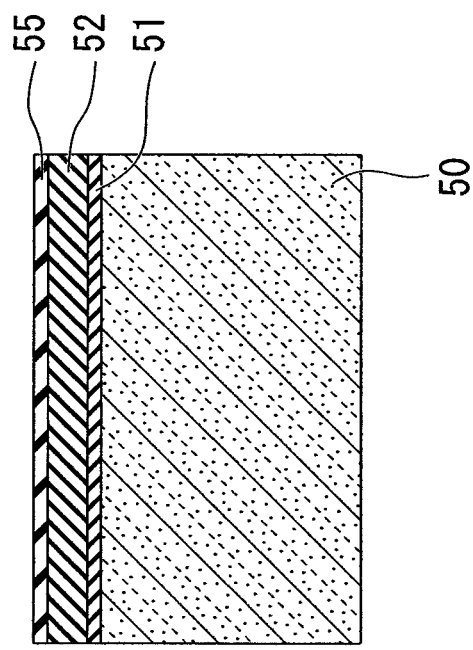
FIG. 4B is a fragmentary cross sectional elevation view, taken along a B-B' line of FIG. 1, illustrating a memory cell in a step, subsequent to the step of FIGS. 3A and 3B, involved in the method of forming the semiconductor device of FIGS. 1, 2A and 2B.
Figure 4A:
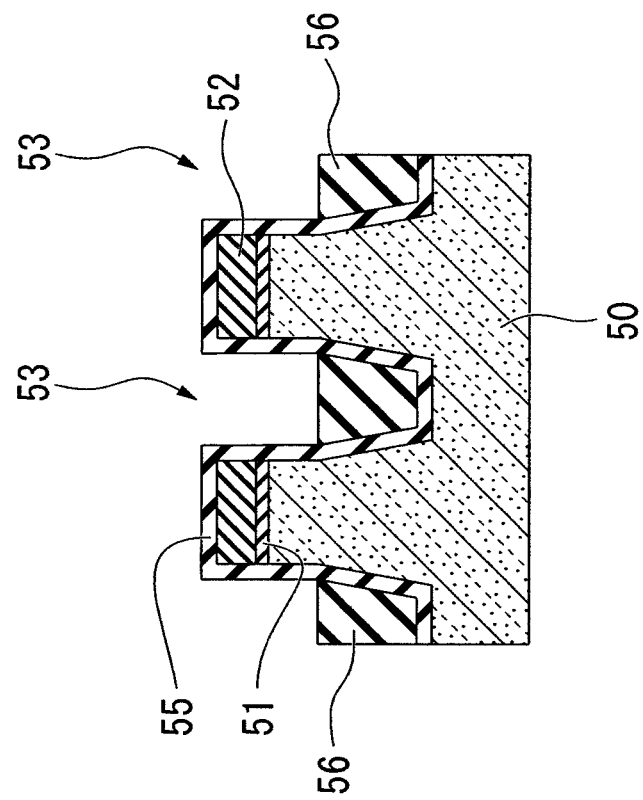
FIG. 4A is a fragmentary cross sectional elevation view, taken along an A-A' line of FIG. 1, illustrating a memory cell in a step, subsequent to the step of FIGS. 3A and 3B, involved in the method of forming the semiconductor device of FIGS. 1, 2A and 2B.

Next, as shown in FIGS. 4A and 4B, a silicon oxide layer 55 is formed using a thermal oxidation method on the surface of the semiconductor substrate 50. Afterwards, a silicon nitride layer is deposited to fill the element isolation trench 53 and then etched back. Thus, the silicon nitride layer is left only in a lower portion of the element isolation trench 53 and filled up to a slightly lower position than the top surface of the semiconductor substrate 50. An element isolation insulating layer 56 having such a thickness is completed as shown in FIGS. 4A and 4B.

Figure 5B:
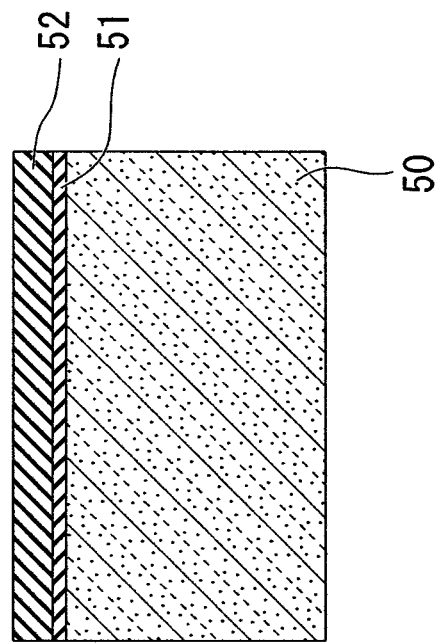
FIG. 5B is a fragmentary cross sectional elevation view, taken along a B-B' line of FIG. 1, illustrating a memory cell in a step, subsequent to the step of FIGS. 4A and 4B, involved in the method of forming the semiconductor device of FIGS. 1, 2A and 2B.
Figure 5A:
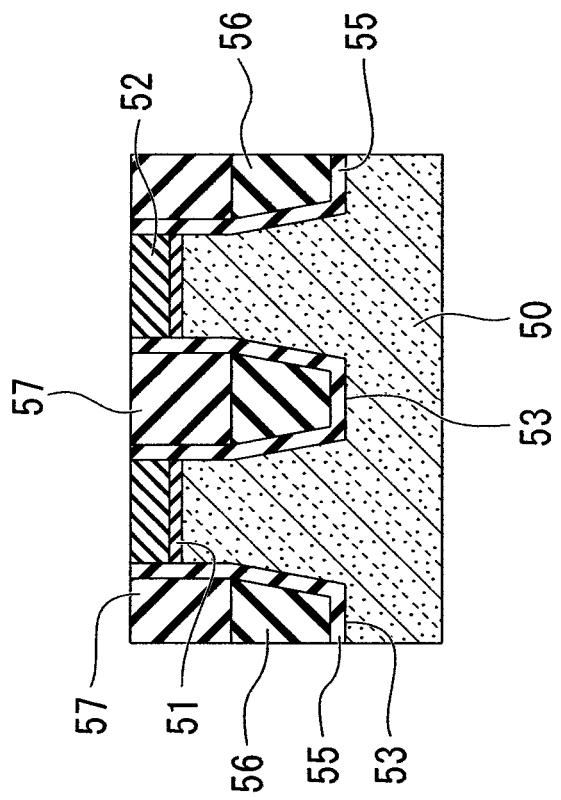
FIG. 5A is a fragmentary cross sectional elevation view, taken along an A-A' line of FIG. 1, illustrating a memory cell in a step, subsequent to the step of FIGS. 4A and 4B, involved in the method of forming the semiconductor device of FIGS. 1, 2A and 2B.

Next, a silicon oxide layer 57 is deposited using a CVD process to fill the inside of the element isolation trench 53. The surface of the silicon oxide layer 57 is planarized using a chemical mechanical polishing (CMP) process as shown in FIGS. 5A and 5B until the silicon nitride layer 52 serving as a mask, which is formed in FIG. 3, is exposed.

Next, the silicon nitride layer 52 serving as the mask and the silicon oxide layer 51 are removed using a wet etching process so that the surface of the element isolation trench 53 is substantially the same level as the surface of the silicon substrate 50. Thus, a line-shaped element isolation region 58 using an STI structure shown in FIGS. 6A and 6B is formed. After the surface of the silicon substrate 50 is exposed, a thermal oxidation process is carried out, thereby forming a silicon oxide layer 60 in the surface of the semiconductor substrate 50.

Subsequently, as shown in FIGS. 6A and 6B, low-concentration N-type impurity ion, such as phosphorus ion, are introduced, thereby forming an N-type low-concentration impurity diffusion layer 61. The N-type low-concentration impurity diffusion layer 61 functions as a portion of source and drain (S/D) regions of a recess-type transistor according to the present invention.

Next, a silicon nitride layer 62 serving as a mask and a carbon layer 63, which is an amorphous carbon layer, are sequentially deposited and patterned to form a gate-electrode trench, which is a trench, as shown in FIGS. 7A and 7B.

Figure 8A:
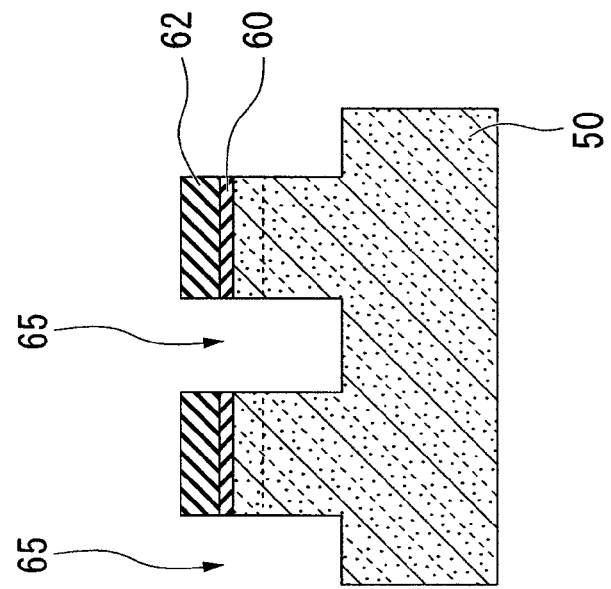
FIG. 8A is a fragmentary cross sectional elevation view, taken along an A-A' line of FIG. 1, illustrating a memory cell in a step, subsequent to the step of FIGS. 7A and 7B, involved in the method of forming the semiconductor device of FIGS. 1, 2A and 2B.
Figure 8B:
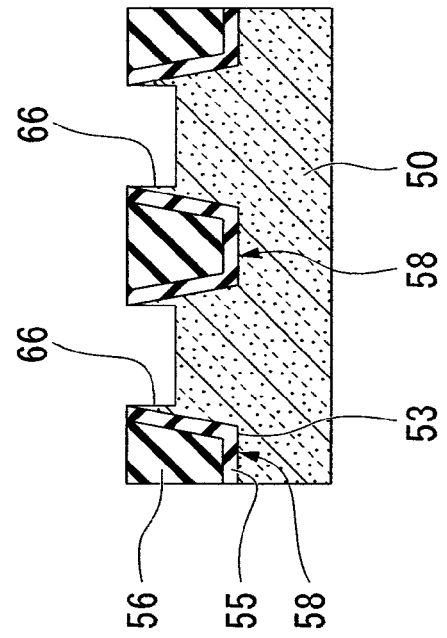
FIG. 8B is a fragmentary cross sectional elevation view, taken along a B-B' line of FIG. 1, illustrating a memory cell in a step, subsequent to the step of FIGS. 7A and 7B, involved in the method of forming the semiconductor device of FIGS. 1, 2A and 2B.

Also, as shown in FIGS. 8A and 8B, the semiconductor substrate 50 is etched using a dry etching process, thereby forming trenches 65, which is a gate-electrode trench. The trench 65 is formed in line-shaped patterns extending in a predetermined direction, which is the Y direction of FIG. 1, to intersect the active region K.

At this time, a top surface of the element isolation region 58 disposed within the trench 65 is also etched, thereby forming a shallow trench in a lower position than the top surface of the semiconductor substrate 50. Etching conditions are controlled such that a silicon oxide layer is etched at a lower etch rate than the semiconductor substrate 50. Thus, the trench 65 is formed as a continuous trench having a lower portion with a step difference. That is, the trench 65 is the continuous trench including a deep trench formed by etching the semiconductor substrate 50 and a shallow trench formed by etching the element isolation region 58. As a result, as shown in FIGS. 8A and 8B, a thin silicon layer is remained as sidewalls 66 in a lateral surface of the trench 65 neighboring the element isolation region 58 and functions as a channel region of a recess-type cell transistor. By etching silicon of the semiconductor 50 to a greater depth than the element isolation region (STI) 58, a channel region of a recess channel transistor is formed as shown in FIGS. 8A and 8B.

Figure 9A:
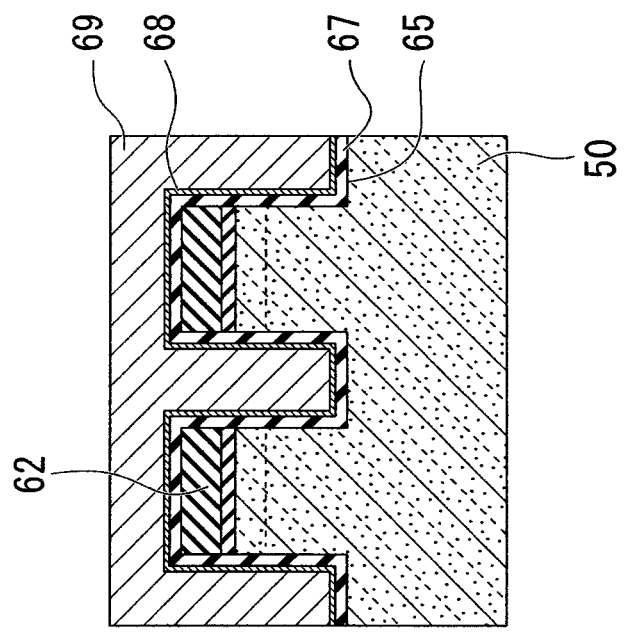
FIG. 9A is a fragmentary cross sectional elevation view, taken along an A-A' line of FIG. 1, illustrating a memory cell in a step, subsequent to the step of FIGS. 8A and 8B, involved in the method of forming the semiconductor device of FIGS. 1, 2A and 2B.
Figure 9B:
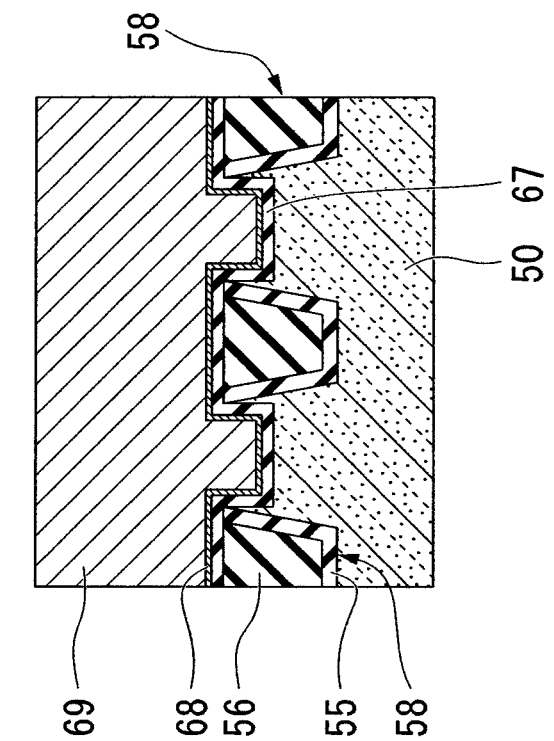
FIG. 9B is a fragmentary cross sectional elevation view, taken along a B-B' line of FIG. 1, illustrating a memory cell in a step, subsequent to the step of FIGS. 8A and 8B, involved in the method of forming the semiconductor device of FIGS. 1, 2A and 2B.

Next, a gate insulating layer 67 is formed as shown in FIGS. 9A and 9B. A silicon oxide layer formed using a thermal oxidation process may be used as the gate insulating layer 67. Afterwards, an inner surface layer 68 which may include titanium nitride (TiN) and a tungsten (W) layer 69 are sequentially deposited.

Next, an etch-back process is performed until the inner surface layer 68 and the tungsten layer 69 are left in a lower portion of the trench 65. Thus, as shown in FIGS. 10A and 10B, a buried word line 70, which constitutes a portion of a gate electrode, and an element isolation buried wiring 73 are formed.

Figure 11A:
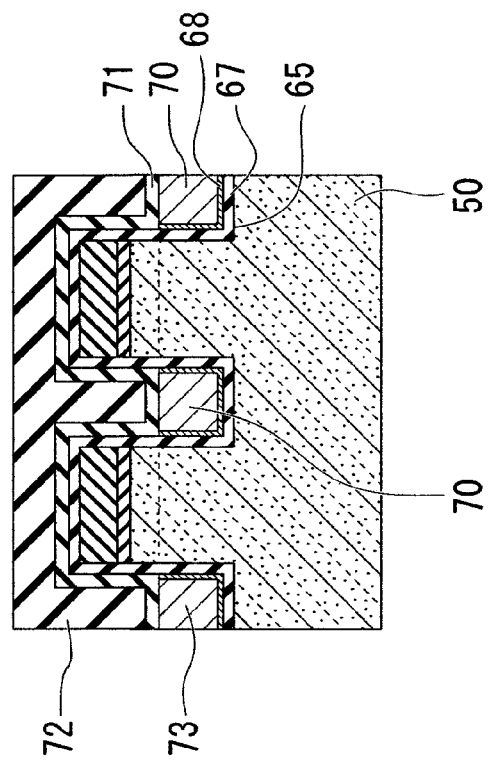
FIG. 11A is a fragmentary cross sectional elevation view, taken along an A-A' line of FIG. 1, illustrating a memory cell in a step, subsequent to the step of FIGS. 10A and 10B, involved in the method of forming the semiconductor device of FIGS. 1, 2A and 2B.
Figure 11B:
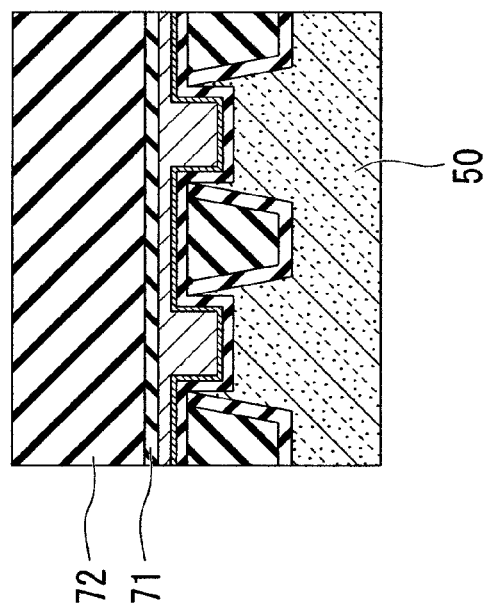
FIG. 11B is a fragmentary cross sectional elevation view, taken along a B-B' line of FIG. 1, illustrating a memory cell in a step, subsequent to the step of FIGS. 10A and 10B, involved in the method of forming the semiconductor device of FIGS. 1, 2A and 2B.

As shown in FIGS. 11A and 11B, a liner layer 71 may include a silicon nitride ($Si_3N_4$) layer to cover the remaining W layer 69 and an inner wall of the trench 65. The liner layer 71 has a thickness of about 10 nm. A buried insulating layer 72 is deposited over the liner layer 71 using a CVD process or an SOD, which is an insulating coating layer which may include polysilazane.

Next, as shown in FIGS. 12A and 12B, the surface of the buried insulating layer 72 is planarized using a CMP process until the liner layer 71 is exposed. Thereafter, the silicon nitride layer serving as a mask and portions of the buried insulating layer 72 and the liner layer 71 are removed using an etching process so that the surface of the buried insulating layer 72 can be at about the same level as the silicon surface of the semiconductor substrate 50. Thus, a buried word line 70 and an element isolation buried wiring 73 are formed, and a buried insulating layer 74 is formed over the buried word line 70 and the buried line 73.

Figure 13A:
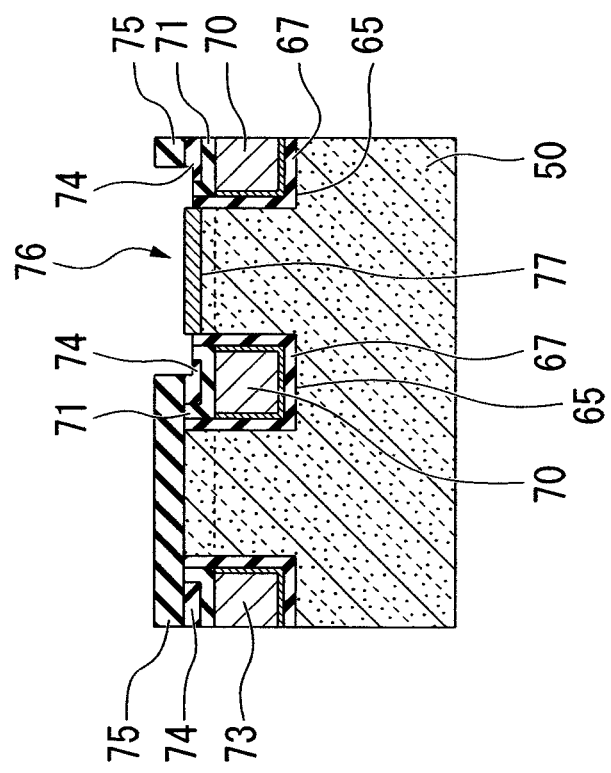
FIG. 13A is a fragmentary cross sectional elevation view, taken along an A-A' line of FIG. 1, illustrating a memory cell in a step, subsequent to the step of FIGS. 12A and 12B, involved in the method of forming the semiconductor device of FIGS. 1, 2A and 2B.
Figure 13B:
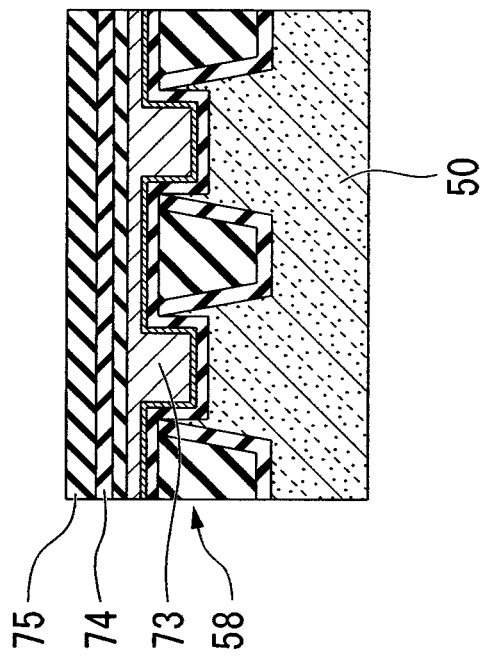
FIG. 13B is a fragmentary cross sectional elevation view, taken along a B-B' line of FIG. 1, illustrating a memory cell in a step, subsequent to the step of FIGS. 12A and 12B, involved in the method of forming the semiconductor device of FIGS. 1, 2A and 2B.

Next, as shown in FIGS. 13A and 13B, a first interlayer insulating layer 75 may include a silicon oxide layer to cover the semiconductor substrate 50. Afterwards, a portion of the first interlayer insulating layer 75 is removed using photolithography and dry etching techniques, thereby forming a bit contact opening 76. As in the case shown in FIG. 1, the bit contact opening 76 is formed in a line-shaped opening pattern extending in the same direction as the buried word line 70 (the Y direction of FIG. 1 or a direction in which the buried word line 70 and the buried line 73 extend in FIGS. 13A and 13B). Hence, the Si surface of the semiconductor substrate 50 is exposed in a portion of the pattern of the bit contact opening 76, which intersects the active region K. Thus, the exposed portion is used as a bit line connection region.

After the bit contact opening 76 is formed, N-type impurity ion, such as arsenic (As) ion, is introduced, thereby forming a high-concentration N-type impurity diffusion layer 77 near the silicon surface of the semiconductor substrate 50. The high-concentration N-type impurity diffusion layer 77 functions as source and drain regions of a recess-type cell transistor.

Figure 14A:
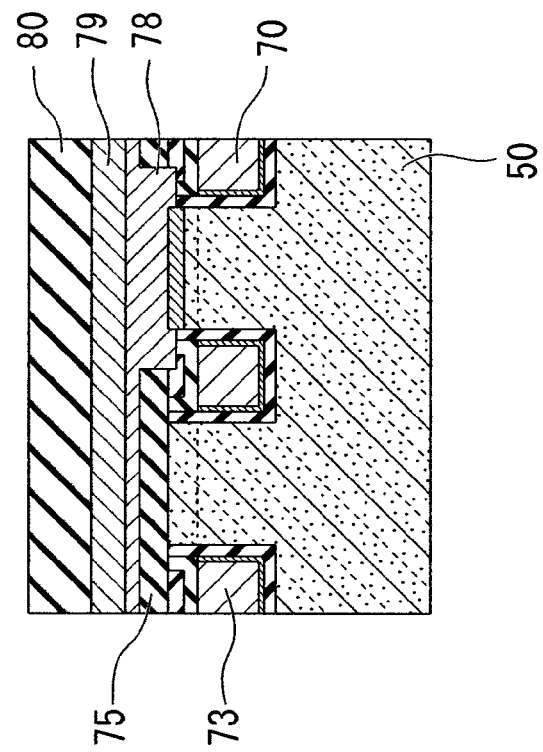
FIG. 14A is a fragmentary cross sectional elevation view, taken along an A-A' line of FIG. 1, illustrating a memory cell in a step, subsequent to the step of FIGS. 13A and 13B, involved in the method of forming the semiconductor device of FIGS. 1, 2A and 2B.
Figure 14B:
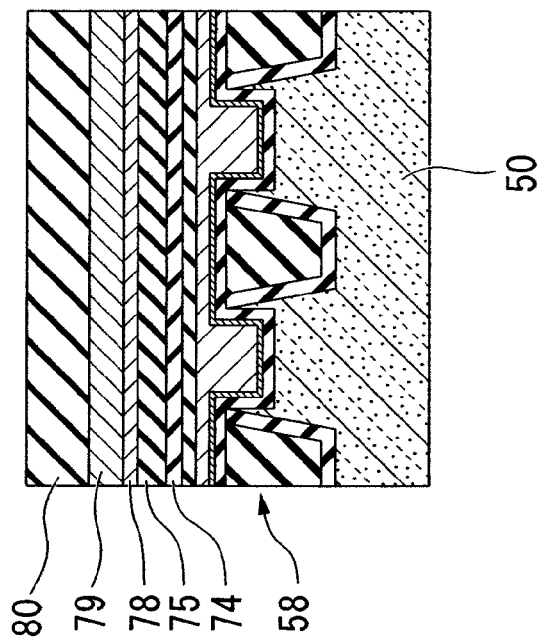
FIG. 14B is a fragmentary cross sectional elevation view, taken along a B-B' line of FIG. 1, illustrating a memory cell in a step, subsequent to the step of FIGS. 13A and 13B involved in the method of forming the semiconductor device of FIGS. 1, 2A and 2B.

Next, as shown in FIGS. 14A and 14B, a lower conductive layer 78 which may include a polysilicon layer containing N-type impurity ion, such as phosphorus ion, a metal layer 79, such as a tungsten layer, and a silicon nitride layer 80 are sequentially deposited over the semiconductor substrate 50.

Specifically, as shown in FIG. 15A, a contact opening 75A is formed in the first interlayer insulating layer 75 to reach a portion of an opening of the trench 65 formed by burying adjacent buried word lines 70 constituting a portion of a gate electrode. The contact opening 75A is formed to such a width so as to cover the high-concentration N-type impurity diffusion layer 77 between the trenches 65 arranged on left or right side with each other in the X direction. Additionally, the contact opening 75A reaches the buried insulating layer 74 formed in openings of the trenches 65 arranged on the left or right side with each other in the X direction.

Also, N-type impurity ion, such as phosphorus ion, are doped onto the semiconductor substrate 50 and the first interlayer insulating layer 75, thereby forming an impurity-doped polysilicon layer 78A. Thus, N-type impurity ion, such as phosphorus ion, is introduced from the semiconductor substrate 50 into the impurity-doped polysilicon layer 78A, so that a high-concentration introduced polysilicon layer 78B can be obtained.

Next, a state of the peripheral circuit region, which is a MOS transistor region, of the DRAM in addition to the cell transistor region will be described with reference to FIGS. 15A through 18D.

Before forming the impurity-doped polysilicon layer 78A as shown in FIG. 15A, a non-doped polysilicon layer 300 is formed in a peripheral circuit region 301 as shown in FIG. 15D. Also, for brevity, an NMOS region and a PMOS region of the peripheral circuit region 301 will be referred to as a first region 302 and a second region 303, respectively. Furthermore, the first and second regions 302 and 303 are electrically isolated from each other by an element isolation insulating layer 304 formed in the semiconductor substrate 50. A gate oxide layer 305 is formed along a region isolated by the element isolation insulating layer 304 of the semiconductor substrate 50 and the surface of the semiconductor substrate 50 surrounded by the isolated region.

Initially, when the impurity-doped polysilicon layer 78A is formed as shown in FIG. 15A, the impurity-doped polysilicon layer 78A is stacked in the peripheral circuit region 301 as well.

In a case where N-type impurity ion, such as phosphorus ion, is introduced as shown in FIG. 15B, after the second region 303 is covered by a photoresist layer 305A, which is a protection layer, in the peripheral circuit region 301, the N-type impurity ion, such as the phosphorus ion, is introduced. Due to the ion implantation process, in the first region 302, the impurity-doped polysilicon layer 78A and the underlying non-doped polysilicon layer 300 are changed into a high-concentration polysilicon diffusion layer 306 containing N-type impurity ion.

Continuously, as shown in FIGS. 15C and 15F, after both the cell transistor region and the first region 302 are covered by a photoresist layer 307, which is a protection layer, P-type ion, such as boron (B) ion, is introduced to the second region 303. As a result, a polysilicon diffusion layer 308 containing high-concentration P-type impurity ion is formed in the impurity-doped polysilicon layer 78B and the underlying non-doped polysilicon layer 300 formed in the second region 303.

Furthermore, the non-doped polysilicon layer 300 is formed in the vicinity of the gate oxide layer 305 in the second region 303 shown in FIG. 15E. Therefore, even if the N-type impurity-doped polysilicon layer 78A is formed over the non-doped polysilicon layer 300, as shown in FIG. 15F, an implantation of P-type ion such as boron ion may be carried out and forming a PMOS transistor in the second region 303 can be accomplished.

As shown in FIGS. 15D through 15F, the non-doped polysilicon layer 300 and the impurity-doped polysilicon layer 78A are used, and an ion implantation is separately performed using photoresist layers 305A and 307. Accordingly, formation of a layer in the cell transistor region is performed while PMOS and NMOS transistors in the peripheral circuit region 301 are separately formed.

Figure 16B:
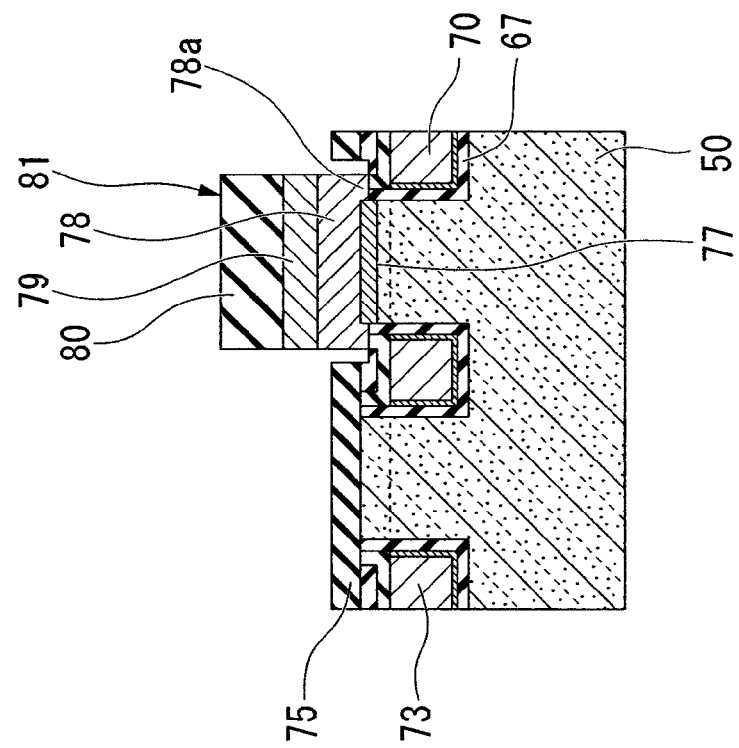
FIG. 16B is a fragmentary cross sectional elevation view, taken along a B-B' line of FIG. 1, illustrating a memory cell in a step, subsequent to the step of FIGS. 14A and 14B involved in the method of forming the semiconductor device of FIGS. 1, 2A and 2B.
Figure 16A:
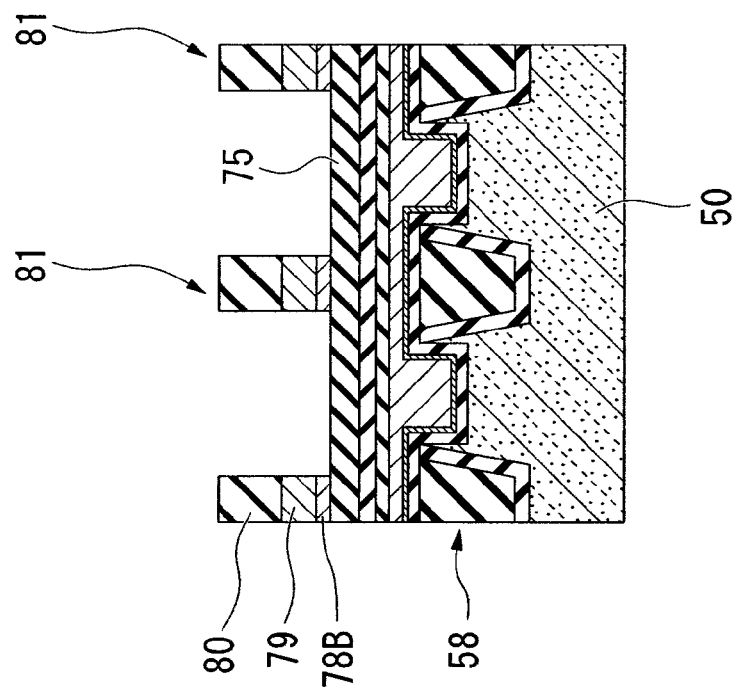
FIG. 16A is a fragmentary cross sectional elevation view, taken along an A-A' line of FIG. 1, illustrating a memory cell in a step, subsequent to the step of FIGS. 14A and 14B involved in the method of forming the semiconductor device of FIGS. 1, 2A and 2B.

Next, in the cell transistor region, as shown in FIGS. 16A and 16B, a stacked layer of the introduced polysilicon layer 78B, the metal layer 79, and the silicon nitride layer 80 may be patterned in a line shape, thereby forming a bit line 81.

In the structure of the one embodiment of the present invention, since the impurity-doped polysilicon layer 78A is applied to the cell region, the bit line 81 may be connected in a low-resistance state to the high-concentration impurity diffusion layer 77 using the impurity-doped polysilicon layer 78A. Furthermore, since the impurity-doped polysilicon layer 78A is used as the same introduced polysilicon layer 78B as described above, the bit line 81 may be connected to the high-concentration impurity diffusion layer 77 by the introduced polysilicon layer 78B. Also, impurity ion may further remain in high-concentration in a contact portion. As a result, the bit line 81 may be connected to the high-concentration impurity diffusion layer 77 in a much lower resistance state.

The bit line 81 is formed in a pattern that extends in a direction, which is the X direction used in the description of the structure of FIG. 1, intersecting the buried word line 70. In addition, although the bit line 81 has a straight line shape disposed at right angles with the buried word line 70 as in the structure shown in FIG. 1, the bit line 81 may be partially curved and have a bent-line or wave-like shape. The lower conductive layer 78 disposed under the bit line 81 is connected to the high-concentration N-type impurity diffusion layer 77, which is one of source and drain regions, formed in the surface of the semiconductor substrate 50. The connecting region is a surface of the semiconductor substrate 50 exposed by the bit contact opening 76. The semiconductor substrate 50 may include silicon.

In addition, side contact portions 78a are formed on both sides of a widthwise direction of the lower conductive layer 78 that constitute lower portions of the bit lines 81. As shown in FIGS. 13A and 13B, when the bit contact opening 76 is formed using an etching process, the side contact portions 78a may be formed by partially etching the buried insulating layer 74 and the gate insulating layer 67 disposed on both edges of a widthwise direction of the bit contact opening 76.

Here, the high-concentration impurity diffusion layer 77 is interposed between the gate insulating layers 67. A contact area between the lower conductive layer 78 and the high-concentration impurity diffusion layer 77 formed in the surface of the semiconductor substrate 50 is increased since the lower conductive layer 78 contacts a top surface of the high-concentration impurity diffusion layer 77 and at least side surface of the high-concentration impurity diffusion layer 77. The increased contact area is advantageous to connecting the bit line 81 and the high-concentration impurity diffusion layer 77, thus contributing to reduction of a connection resistance.

In other words, the semiconductor substrate 50 has a groove. The high-concentration impurity diffusion layer 77 is formed in the groove. A bottom of the groove is lower than a top of the high-concentration impurity diffusion layer 77. The bottom of the groove is adjacent to the side surface of the high-concentration impurity diffusion layer 77. The lower conductive layer 78 contacts the bottom of the groove.

Also, the lower conductive layer 78 may be formed in the groove. A bottom of a first portion of the groove is higher than a bottom of a second portion of the groove. A portion of the semiconductor substrate under the first portion includes an impurity. The lower conductive layer 78 covers the portion of the semiconductor substrate 50 under the first portion and at least a portion of the semiconductor substrate 50 under the second portion. The lower conductive layer 78 may contact the bottom of the groove.

Here, the lower conductive layer 78 has a side contact portion contacting the side surface of the impurity region. The side contact portion is lower than the top surface of the high-concentration impurity diffusion layer 77. Additionally, the high-concentration impurity diffusion layer 77 is interposed between the gate insulating layer 67.

Next, as shown in FIGS. 15A and 15B, a stacked layer of the doped polysilicon layer 78B, the metal layer 79, and the silicon nitride layer 80 is patterned in a line shape to form the bit line 81. As shown in FIGS. 17A through 18D, a MOS transistor is formed in the peripheral circuit region 301 as well.

Figure 17A:
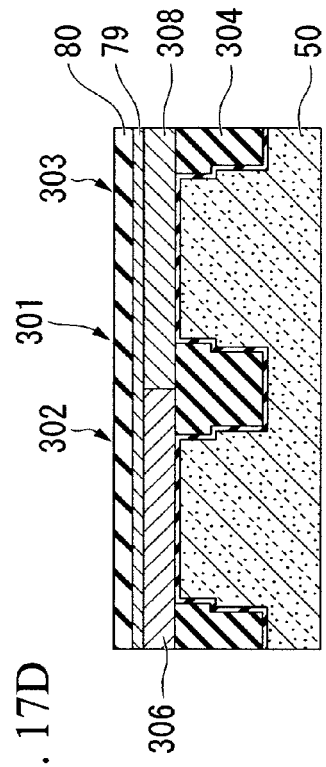
FIG. 17A is a fragmentary cross sectional elevation view, illustrating a memory cell in a step, subsequent to the step of FIGS. 15A and 15B, involved in the method of forming the semiconductor device of FIGS. 1, 2A and 2B.
Figure 17B:
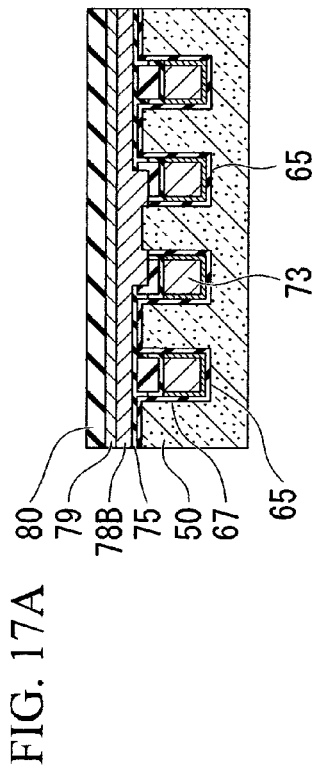
FIG. 17B is a fragmentary cross sectional elevation view, illustrating a memory cell in a step, subsequent to the step of FIG. 17A, involved in the method of forming the semiconductor device of FIGS. 1, 2A and 2B.
Figure 17C:
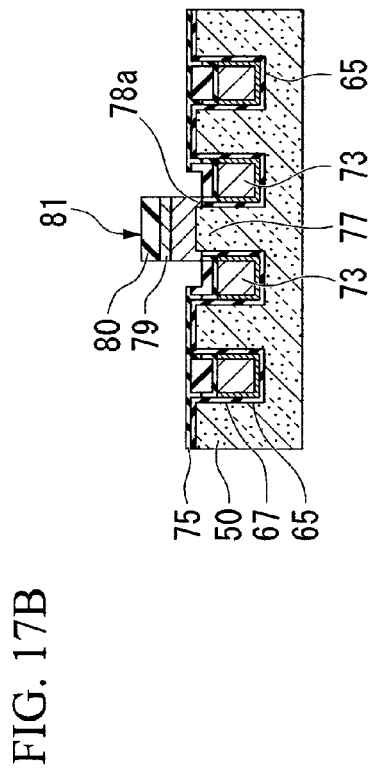
FIG. 17C is a fragmentary cross sectional elevation view, illustrating a memory cell in a step, subsequent to the step of FIG. 17B, involved in the method of forming the semiconductor device of FIGS. 1, 2A and 2B.
Figure 17D:
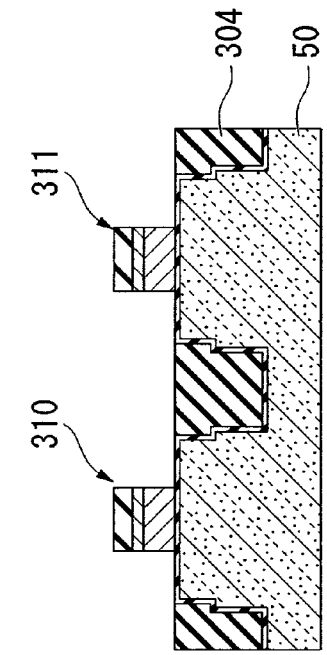
FIG. 17D is a fragmentary cross sectional elevation view, illustrating a memory cell in a step, subsequent to the step of FIGS. 15A and 15B, involved in the method of forming the semiconductor device of FIGS. 1, 2A and 2B.
Figure 17E:
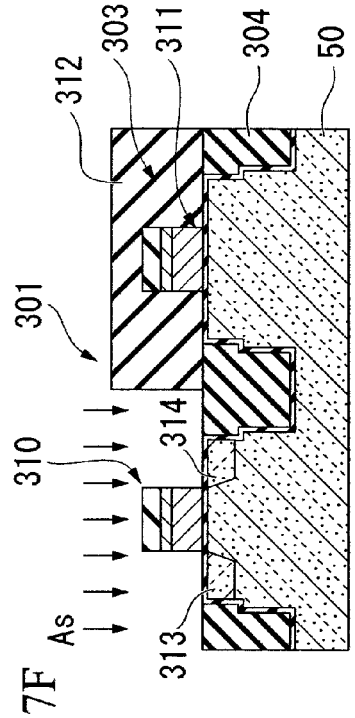
FIG. 17E is a fragmentary cross sectional elevation view, illustrating a memory cell in a step, subsequent to the step of FIG. 17D, involved in the method of forming the semiconductor device of FIGS. 1, 2A and 2B.
Figure 17F:
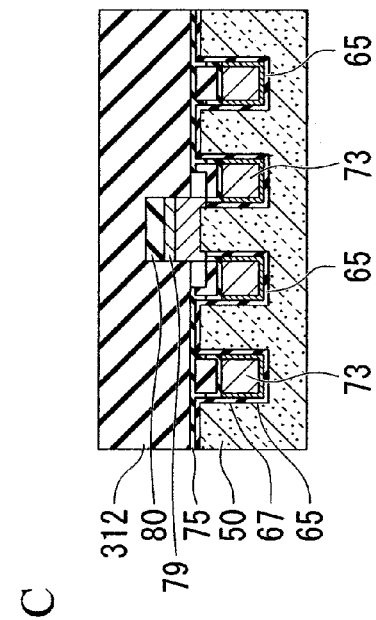
FIG. 17F is a fragmentary cross sectional elevation view, a memory cell in a step, subsequent to the step of FIG. 17E, involved in the method of forming the semiconductor device of FIGS. 1, 2A and 2B.

The metal layer 79 and the silicon nitride layer 80 are formed over the introduced polysilicon layer 78B as shown in FIG. 17A, as well as in the peripheral circuit region 301 shown in FIG. 17D. Also, while the bit line 81 is patterned as shown in FIG. 17B, the high-concentration polysilicon diffusion layer 306 containing N-type impurity ion and the high-concentration polysilicon diffusion layer 308 containing P-type impurity ion may be patterned as shown in FIG. 17E. The gate electrodes 310 and 311 are formed in the first and second regions 302 and 303, respectively. Next, the entire cell transistor region and the second region 303 of the peripheral circuit region are covered by a photoresist layer 312 as shown in FIGS. 17C and 17F. Impurity ion, such as arsenic (As) ion, is introduced into the vicinity of the gate electrode 310 of the first region 302 as shown in FIG. 17F, thereby forming impurity diffusion layers 313 and 314 in the surface of the semiconductor substrate 50 on both sides of the gate electrode 310.

Figure 18A:
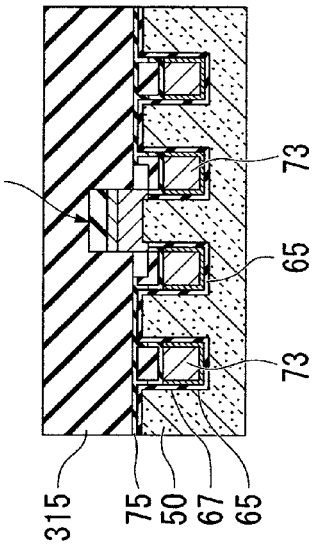
FIG. 18A is a fragmentary cross sectional elevation view, a memory cell in a step, subsequent to the step of FIG. 17C, involved in the method of forming the semiconductor device of FIGS. 1, 2A and 2B.
Figure 18B:
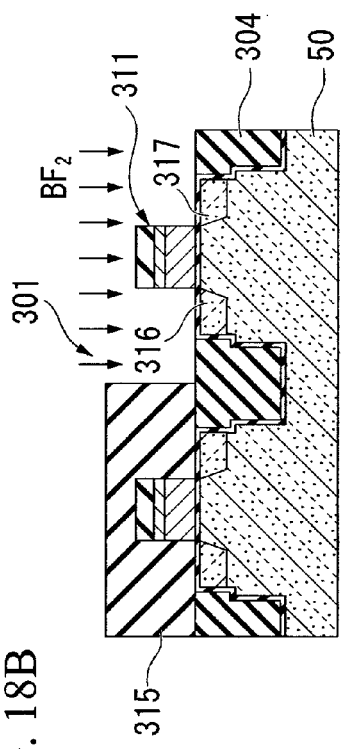
FIG. 18B is a fragmentary cross sectional elevation view, illustrating a memory cell in a step, subsequent to the step of FIG. 117D, involved in the method of forming the semiconductor device of FIGS. 1, 2A and 2B.
Figure 18C:
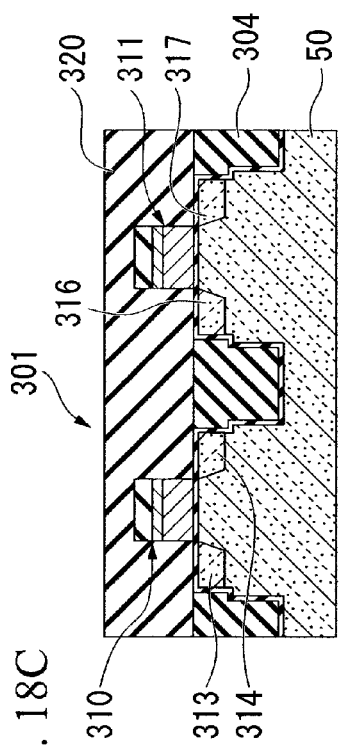
FIG. 18C is a fragmentary cross sectional elevation view, illustrating a memory cell in a step, subsequent to the step of FIG. 18B, involved in the method of forming the semiconductor device of FIGS. 1, 2A and 2B.

Next, the photoresist layer 312 is removed. The cell transistor region and the first region 302 are covered by a photoresist layer 315 as shown in FIGS. 18A and 18B. As shown in FIG. 18B, impurity ion, such as boron fluoride ($BF_2$) ion, may be introduced into the vicinity of the gate electrode 311 of the exposed second region 303. Impurity diffusion layers 316 and 317 are formed in the surface of the semiconductor substrate 50 on both sides of the gate electrode 311 for source and drain regions.

Figure 18D:
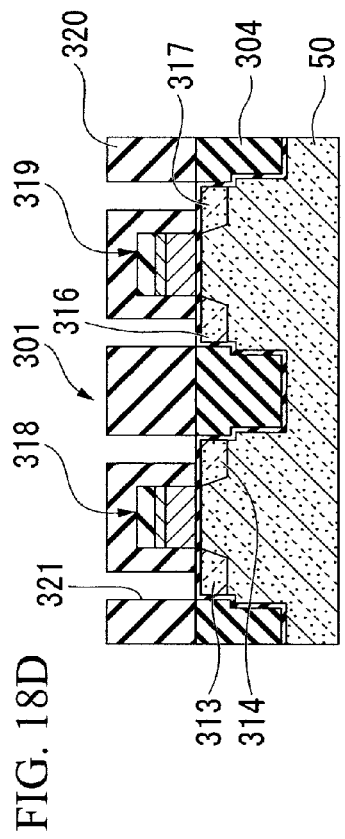
FIG. 18D is a fragmentary cross sectional elevation view, illustrating a memory cell in a step, subsequent to the step of FIG. 18A, involved in the method of forming the semiconductor device of FIGS. 1, 2A and 2B.
Figure 19:
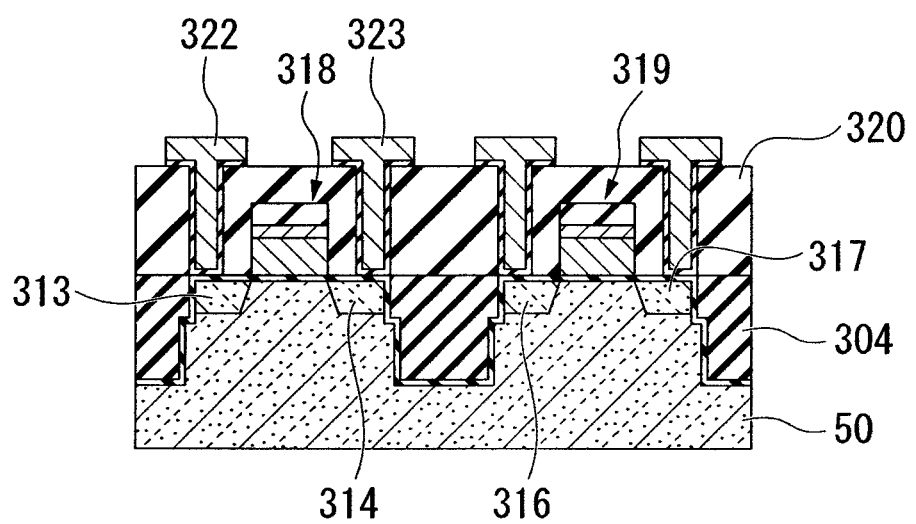
FIG. 19 is a fragmentary cross sectional elevation view, illustrating a memory cell in a step, subsequent to the step of FIGS. 18A and 18B, involved in the method of forming the semiconductor device of FIGS. 1, 2A and 2B.

In the above-described process, an NMOS transistor 318 and a PMOS transistor 319 may be formed in the peripheral circuit region 301. Subsequently, as shown in FIG. 18D, the following fabrication process is performed. An interlayer insulating layer 320 is formed. A contact opening 321 is formed in the interlayer insulating layer 320. Contact plugs 322 and 323 are formed. Fabrication of basic components of the transistors in the peripheral circuit region is accomplished as shown in FIG. 19.

In the cell transistor region, as shown in FIGS. 20A and 20B, after a silicon nitride layer 82 is formed to cover lateral surfaces of the bit line 81, a liner layer 83 may include a silicon nitride layer to cover a top surface of the silicon nitride layer 82.

Furthermore, as described above, the stack layer for the bit line 81 may function also as the gate electrodes 310 and 311 of the MOS transistor in the peripheral circuit of the semiconductor memory device. The silicon nitride layer 82 formed to cover the lateral surfaces of the bit lines 81 may be used as portions of sidewalls of the gate electrodes 310 and 311 in the peripheral circuit region However, a description of sidewalls is omitted from the description presented with reference to FIGS. 17A through 18D.

Figure 21B:
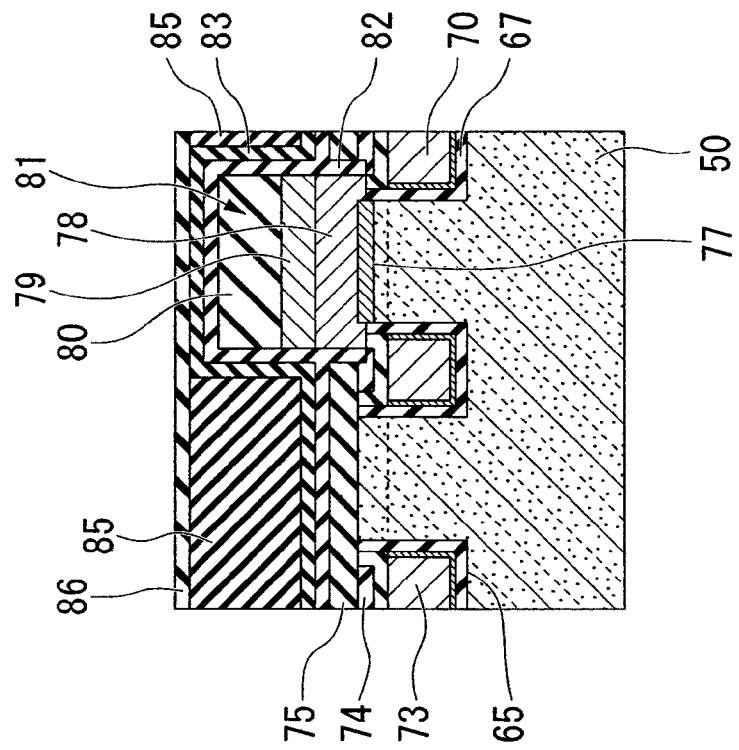
FIG. 21B is a fragmentary cross sectional elevation view, taken along a B-B' line of FIG. 1, illustrating a memory cell in a step, subsequent to the step of FIGS. 20A and 20B, involved in the method of forming the semiconductor device of FIGS. 1, 2A and 2B.
Figure 21A:
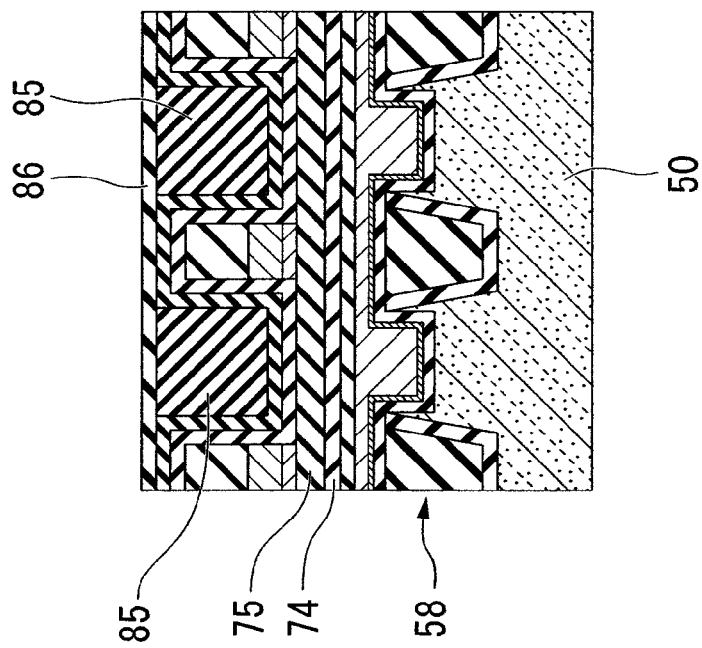
FIG. 21A is a fragmentary cross sectional elevation view, taken along an A-A' line of FIG. 1, illustrating a memory cell in a step, subsequent to the step of FIGS. 20A and 20B, involved in the method of forming the semiconductor device of FIGS. 1, 2A and 2B.

Next, a SOD layer, which is an insulating coating layer which may include polysilazane, is formed to fill space portions 81A between the bit lines 81 shown in FIGS. 20A and 20B. An annealing process is performed at a high temperature in a moisture ($H_2O$) atmosphere so that the SOD layer can be reformed into a solid deposition layer 85. The resultant structure is planarized using a CMP process until the surface of the liner layer 83 is exposed. Afterwards, as shown in FIGS. 21A and 21B, a second interlayer insulating layer 86 may include a silicon oxide layer using a CVD process to cover the surface of the deposition layer 85.

Figure 22B:
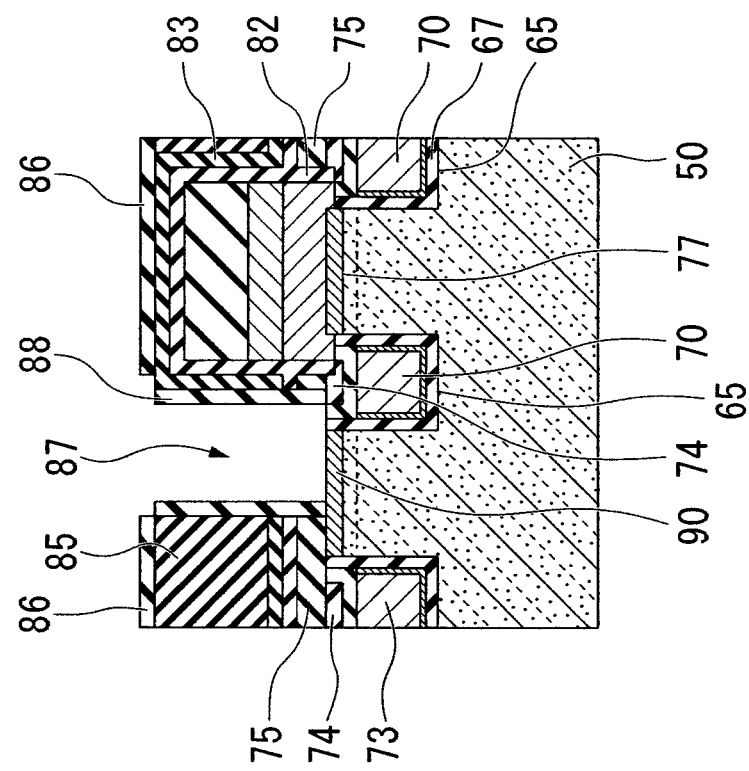
FIG. 22B is a fragmentary cross sectional elevation view, taken along a B-B' line of FIG. 1, illustrating a memory cell in a step, subsequent to the step of FIGS. 21A and 21B, involved in the method of forming the semiconductor device of FIGS. 1, 2A and 2B.
Figure 22A:
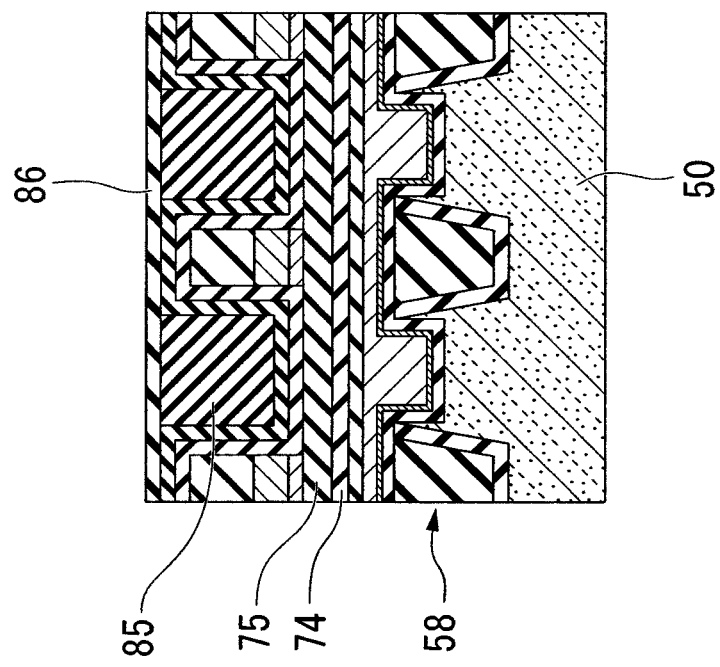
FIG. 22A is a fragmentary cross sectional elevation view, taken along an A-A' line of FIG. 1, illustrating a memory cell in a step, subsequent to the step of FIGS. 21A and 21B, involved in the method of forming the semiconductor device of FIGS. 1, 2A and 2B.

Next, as shown in FIGS. 22A and 22B, a capacitor contact opening 87 is formed using photolithography and dry etching techniques. In the case of the structure described above with reference to FIG. 1, the capacitor contact opening 87 is formed in a position corresponding to the capacitor contact plug forming region 17. Here, a self-aligned contact (SAC) process may be performed using the silicon nitride layer 82 and the liner layer 83 formed on lateral surfaces of the bit lines 81 as sidewalls, thereby forming the capacitor contact opening 87.

The surface of the semiconductor substrate 50 is exposed in a portion where the capacitor contact opening 87 intersects the active region K. The buried insulating layer 74 disposed on the buried word line 70 configured to fill the trench 65 is disposed under the exposed portion.

Next, as shown in FIGS. 22A and 22B, sidewalls 88 may include a silicon nitride layer to cover inner walls of the capacitor contact openings 87. After forming the sidewalls 88, N-type impurity ion, such as phosphorus ion, is introduced into the surface of the semiconductor substrate 50, thereby forming a high-concentration N-type impurity diffusion layer 90 near the surface of the semiconductor substrate 50. The resultant high-concentration N-type impurity diffusion layer 90 functions as a source or drain region of a recess-type transistor according to the one embodiment of the present invention.

Figure 23B:
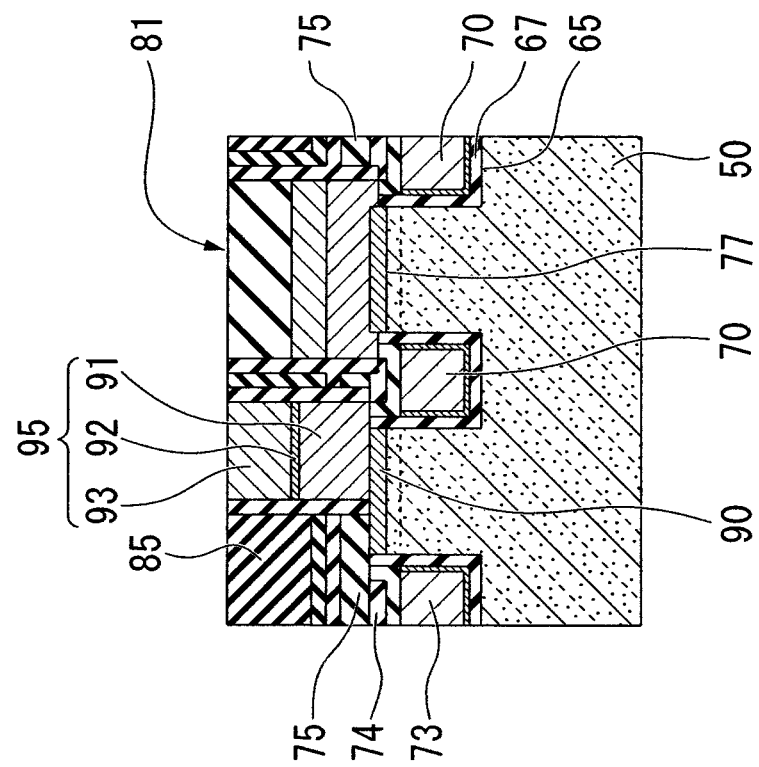
FIG. 23B is a fragmentary cross sectional elevation view, taken along a B-B' line of FIG. 1, illustrating a memory cell in a step, subsequent to the step of FIGS. 22A and 22B, involved in the method of forming the semiconductor device of FIGS. 1, 2A and 2B.
Figure 23A:
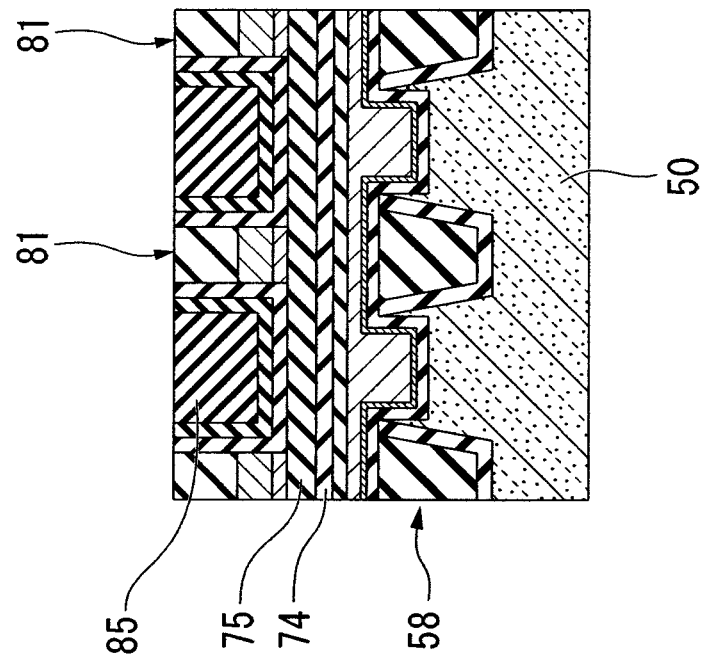
FIG. 23A is a fragmentary cross sectional elevation view, taken along an A-A' line of FIG. 1, illustrating a memory cell in a step, subsequent to the step of FIGS. 22A and 22B, involved in the method of forming the semiconductor device of FIGS. 1, 2A and 2B.

Next, as shown in FIGS. 23A and 23B, a P-containing polysilicon layer is deposited and then etched back to leave the polysilicon layer in a lower portion of the capacitor contact opening 87, thereby forming a lower conductive layer 91. Afterwards, a silicide layer 92 may include cobalt silicide (CoSi) on the surface of the lower conductive layer 91. A metal layer 93, such as a tungsten layer, is deposited to fill the capacitor contact opening 87. The resultant structure is planarized using a CMP process until the surface of the deposition layer 85 is exposed, so that the metal layer 93, such as the tungsten layer, can be remained only within the capacitor contact opening 87. Thus, a capacitor contact plug 95 with a triple layer structure may be formed.

Also, in the structure of the one embodiment of the present invention, as shown in FIGS. 23A and 23B, the capacitor contact plug 95 is formed over the high-concentration impurity diffusion layer 90 disposed between adjacent buried word lines 70 The bit line 81 is formed over the high-concentration impurity diffusion layer 77. Thus, the capacitor contact plug 95 and the bit line 81 are finely disposed over the buried word line 70 of the trench structure, thereby contributing to miniaturization.

Figure 24B:
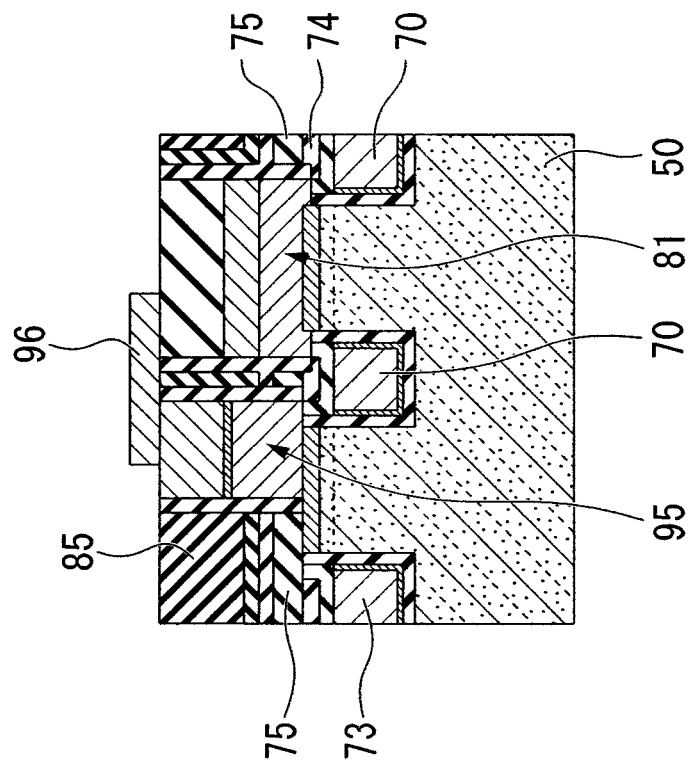
FIG. 24B is a fragmentary cross sectional elevation view, taken along a B-B' line of FIG. 1, illustrating a memory cell in a step, subsequent to the step of FIGS. 23A and 23B, involved in the method of forming the semiconductor device of FIGS. 1, 2A and 2B.
Figure 24A:
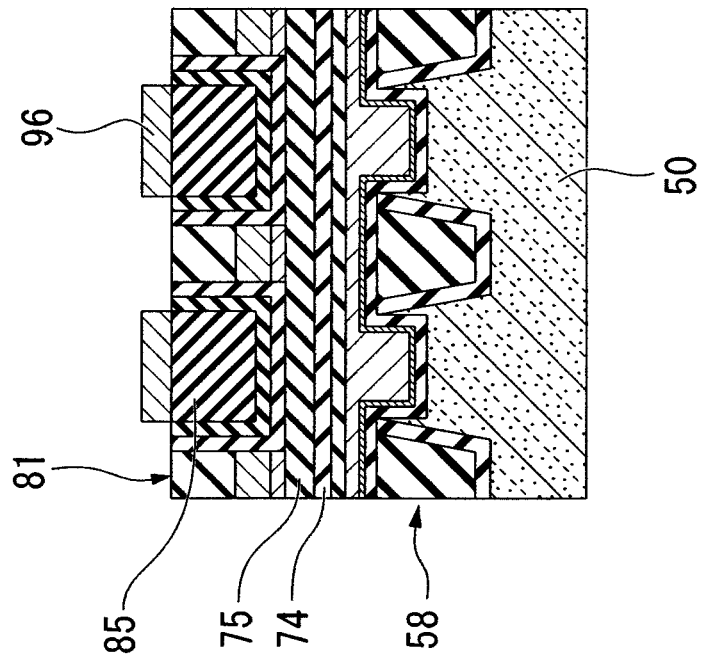
FIG. 24A is a fragmentary cross sectional elevation view, taken along an A-A' line of FIG. 1, illustrating a memory cell in a step, subsequent to the step of FIGS. 23A and 23B, involved in the method of forming the semiconductor device of FIGS. 1, 2A and 2B.

Next, a tungsten nitride (WN) layer and a tungsten layer are sequentially deposited and patterned, thereby forming a capacitor contact pad 96 shown in FIGS. 24A and 24B. The capacitor contact pad 96 is connected to the capacitor contact plug 95.

Figure 25B:
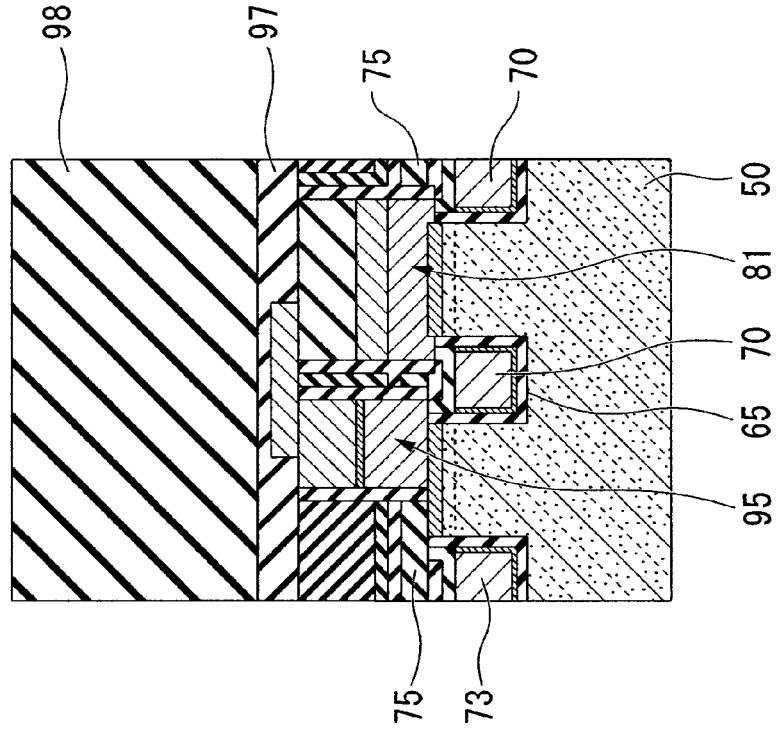
FIG. 25B is a fragmentary cross sectional elevation view, taken along a B-B' line of FIG. 1, illustrating a memory cell in a step, subsequent to the step of FIGS. 24A and 24B, involved in the method of forming the semiconductor device of FIGS. 1, 2A and 2B.
Figure 25A:
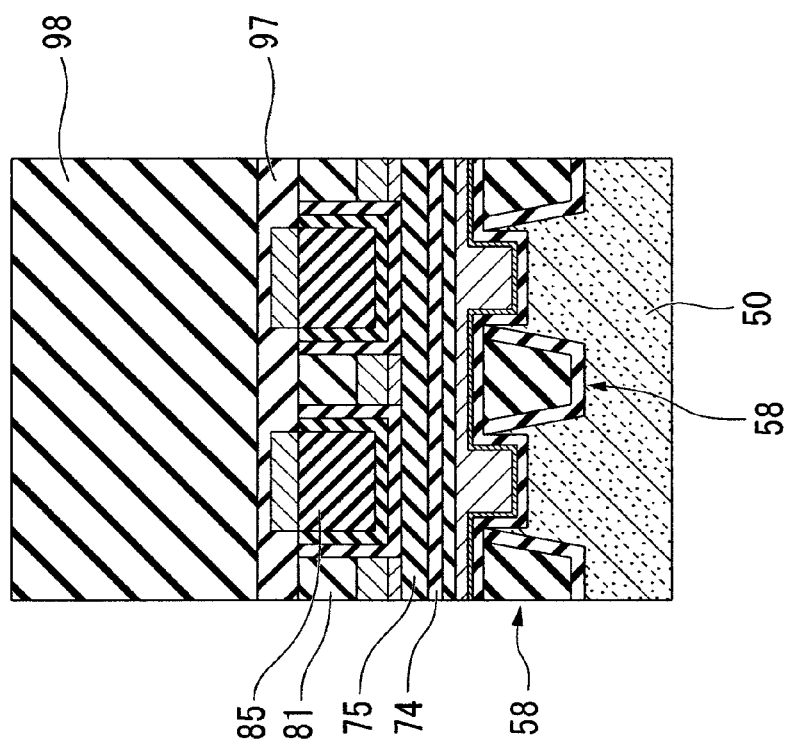
FIG. 25A is a fragmentary cross sectional elevation view, taken along an A-A' line of FIG. 1, illustrating a memory cell in a step, subsequent to the step of FIGS. 24A and 24B, involved in the method of forming the semiconductor device of FIGS. 1, 2A and 2B.

Next, as shown in FIGS. 25A and 25B, after a stopper layer 97 may include a silicon nitride layer to cover the capacitor contact pad 96, a third interlayer insulating layer 97 may include a silicon oxide layer.

Figure 26A:
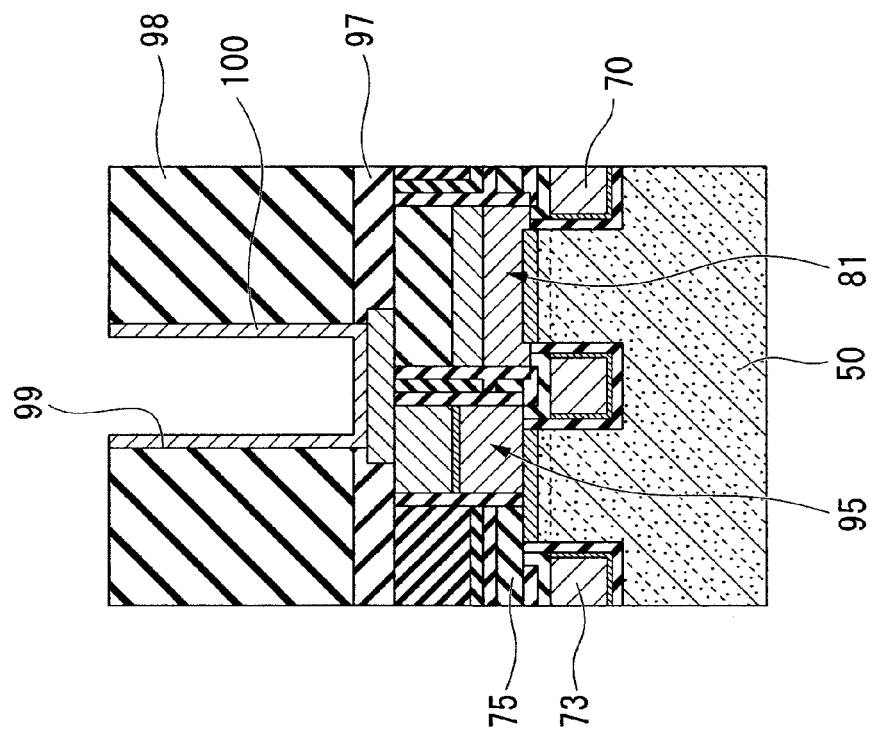
FIG. 26A is a fragmentary cross sectional elevation view, taken along an A-A' line of FIG. 1, illustrating a memory cell in a step, subsequent to the step of FIGS. 25A and 25B, involved in the method of forming the semiconductor device of FIGS. 1, 2A and 2B.
Figure 26B:
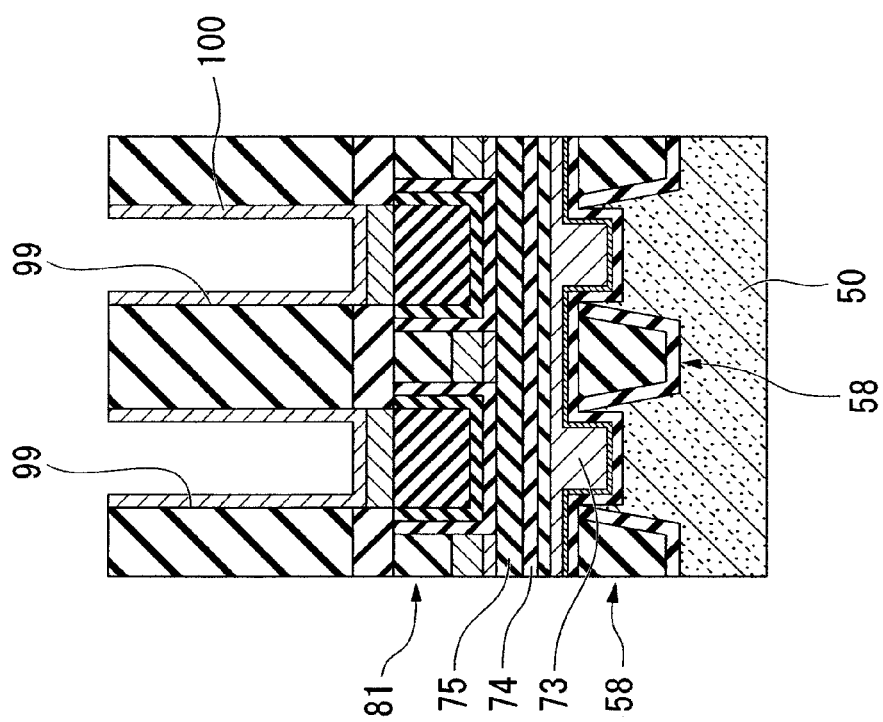
FIG. 26B is a fragmentary cross sectional elevation view, taken along a B-B' line of FIG. 1, illustrating a memory cell in a step, subsequent to the step of FIGS. 25A and 25B, involved in the method of forming the semiconductor device of FIGS. 1, 2A and 2B.

Thereafter, as shown in FIGS. 26A and 26B, an opening 99, which is a contact hole, is formed through the third interlayer insulating layer 98 and the stopper layer 97 to expose the top surface of the capacitor contact pad 96. Afterwards, a lower electrode 100 of a capacitor may include titanium nitride to cover an inner wall of the opening 99. A lower portion of the lower electrode 100 is connected to the capacitor contact pad 96.

Next, as shown in FIGS. 27A and 27B, after a capacitor insulating layer 101 is formed to cover the surface of the lower electrode 100, an upper electrode 102 of the capacitor may include titanium nitride. Thus, a capacitor 103 may be formed. The capacitor insulating layer 101 may include zirconium oxide ($ZrO_2$), aluminum oxide ($Al_2O_3$), hafnium oxide ($HfO_2$), or a stacked layer thereof.

Figure 28A:
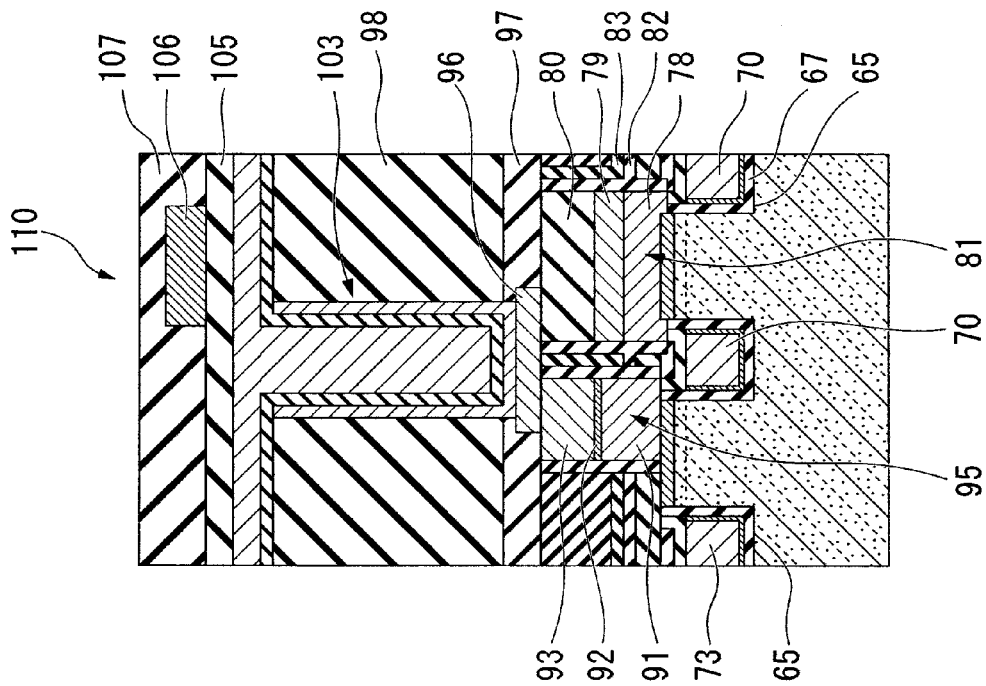
FIG. 28A a fragmentary cross sectional elevation view, taken along an A-A' line of FIG. 1, illustrating a memory cell in a step, illustrating another embodiment of the present invention.
Figure 28B:
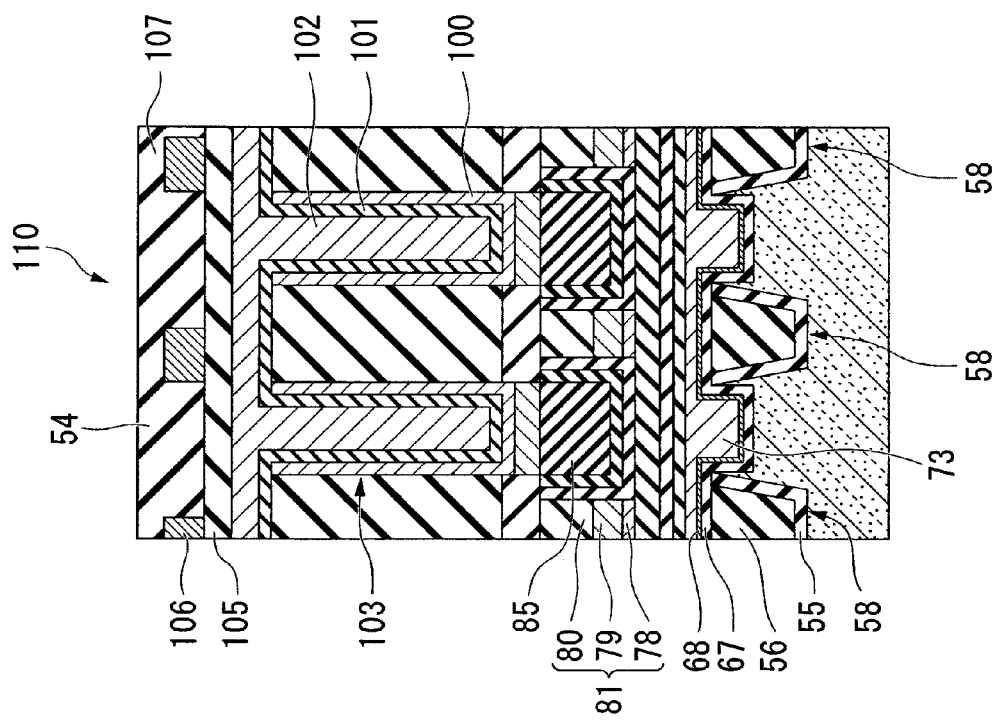
FIG. 28B a fragmentary cross sectional elevation view, taken along an B-B' line of FIG. 1, illustrating a memory cell in a step, illustrating another embodiment of the present invention.

Next, as shown in FIGS. 28A and 28B, after a fourth interlayer insulating layer 105 may include a silicon oxide layer to cover the surface of the upper electrode 102, an upper metal interconnection 106 may include aluminum (Al) or copper (Cu). Afterwards, a surface protection layer 107 is formed. As a result, as shown in FIGS. 28A and 28B, a semiconductor memory device 110 having the same structure as the semiconductor memory device 1, which is a DRAM, shown in FIGS. 1, 2A, and 2B is completed.

Figure 29:
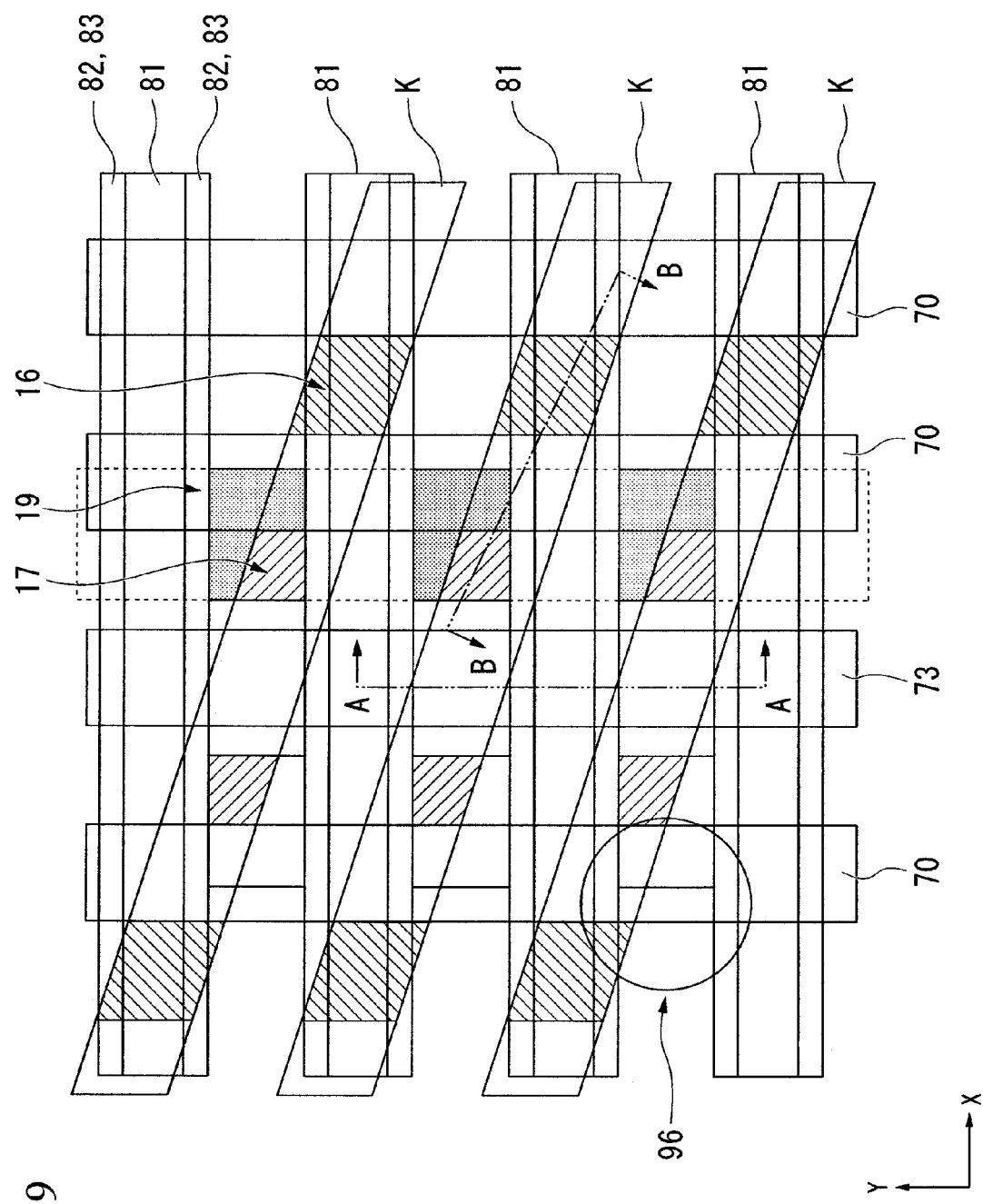
FIG. 29 a fragmentary plan view integrally illustrating a memory cell including a semiconductor device in accordance with one embodiment of the present invention.

In addition, FIG. 29 shows a planar structure of a partial interconnection structure of the semiconductor memory device 110 obtained according to the above-described fabrication method.

The interconnection structure of FIG. 29 shows the insulating layer 82 and the liner layer 83 disposed on both sides of the bit lines, which are omitted from the interconnection structure of FIG. 1. FIG. 29 clearly shows the capacitor contact plug forming region 17 defined between the bit lines 81 adjacent to each other in the Y direction In view of the capacitor contact plug forming region shown in FIG. 29, it can be clearly understood that the capacitor contact opening 87 described above with reference to FIGS. 22A and 22B is precisely formed by an SAC technique using the liner layer 83 as sidewalls. The capacitor contact plug 95 is formed using the capacitor contact opening 87.

Figure 30A:
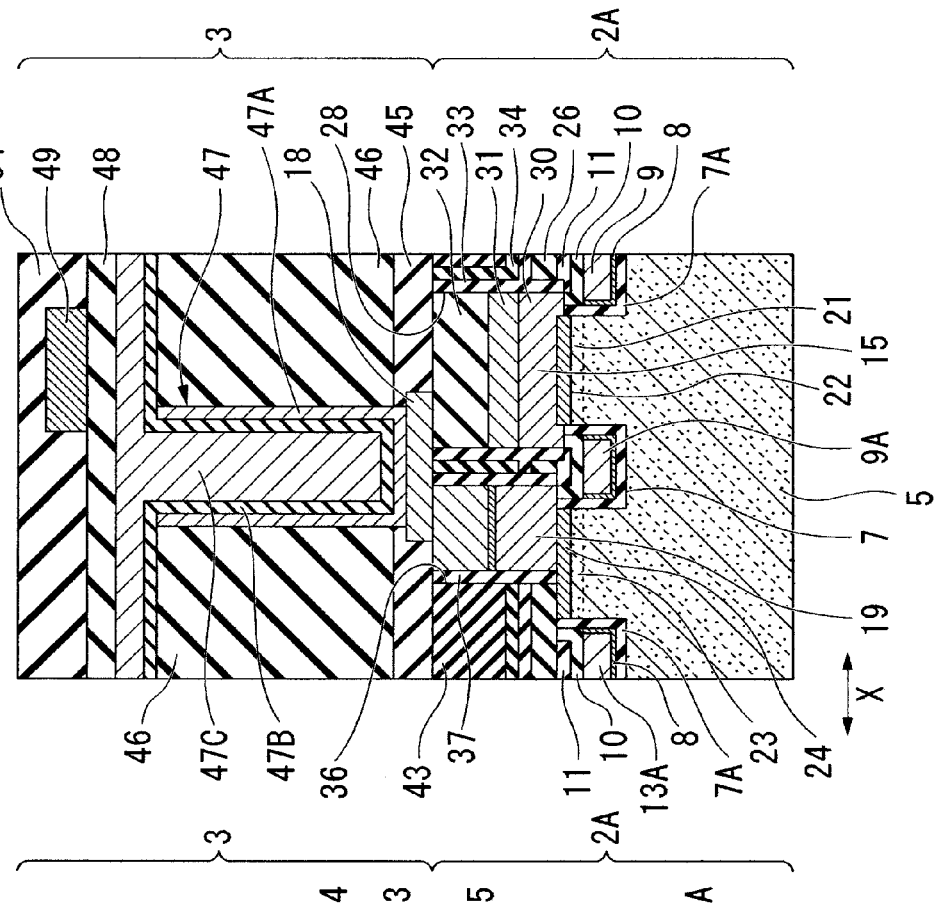
FIG. 30A is a fragmentary cross sectional elevation view, taken along an A-A' line of FIG. 1, illustrating a memory cell including a semiconductor device in accordance with another embodiment of the present invention.
Figure 30B:
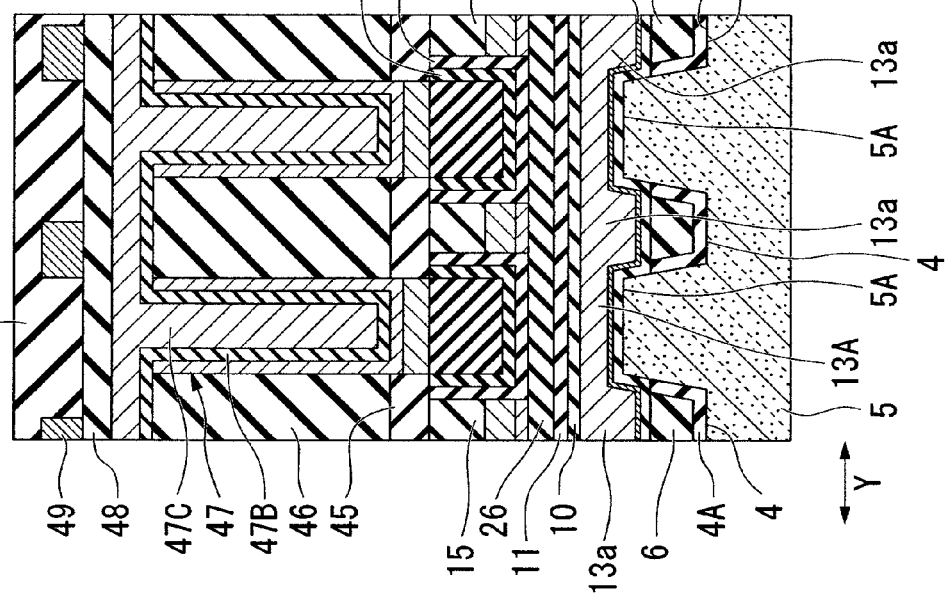
FIG. 30B is a fragmentary cross sectional elevation view, taken along a B-B' line of FIG. 1, illustrating a memory cell including a semiconductor device in accordance with another embodiment of the present invention.

FIGS. 30A and 30B show an example of a structure of a semiconductor memory device including a saddle fin cell transistor instead of the semiconductor memory device 1 including the recess channel cell transistor described above with reference to FIGS. 1, 2A, and 2B.

A semiconductor memory device 111 according to the one embodiment of the present invention is substantially the same as the semiconductor memory device 1 according to the previous embodiment except for the cell transistor.

FIG. 30A is a cross-sectional view corresponding to line A-A' of the semiconductor memory device 1 of FIG. 1, and FIG. 30B is a cross-sectional view corresponding to line B-B' of the semiconductor memory device 1 of FIG. 1. The semiconductor memory device 111 according to the one embodiment of the present invention schematically includes a cell transistor forming region 2A and a capacitor forming region 3 shown in sectional structures of FIGS. 30A and 30B.

In the semiconductor memory device of the one embodiment of the present invention, an electrode of a side contact portion 13a, which contacts a side surface of the a high-concentration impurity diffusion layer 22, is formed in a buried line 13A to overlap element isolation trench 4. Thus, a convex portion 5A formed in the surface of a semiconductor substrate located between the side contact portion of electrodes 13a adjacent to each other in a Y direction of FIG. 30A is used as a channel region, unlike in the cell transistor of the semiconductor memory device 1 of the previous embodiment.

FIGS. 31 and 32 are diagrams illustrating a process of fabricating a saddle fin cell transistor according to the one embodiment of the present invention.

Figure 31A:
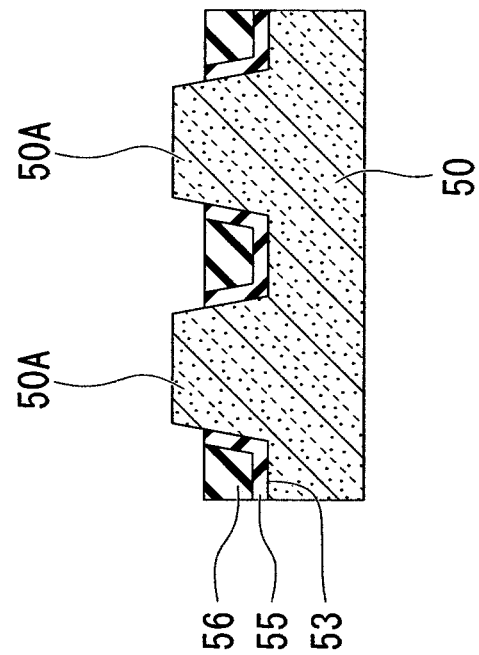
FIG. 31A is a fragmentary cross sectional elevation view, taken along an A-A' line of FIG. 1, illustrating a memory cell including a semiconductor device in accordance with another embodiment of the present invention.
Figure 31B:
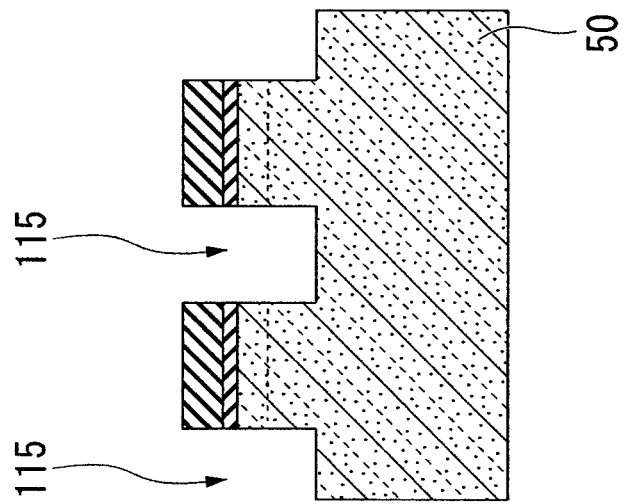
FIG. 31B is a fragmentary cross sectional elevation view, taken along a B-B' line of FIG. 1, illustrating a memory cell including a semiconductor device in accordance with another embodiment of the present invention.

Like the semiconductor memory device 1 according to the embodiment described above, according to the method described with reference to FIGS. 3A through 7B, a method of fabricating the semiconductor memory device 111 according to the one embodiment of the present invention includes the following processes. A silicon nitride layer 62 for a mask and a carbon layer 63 which is an amorphous carbon layer are sequentially deposited on a semiconductor substrate 50 as shown in FIGS. 7A and 7B. A pattern for forming gate-electrode trenches, which are trenches, is formed as shown in FIGS. 7A and 7B. The semiconductor substrate 50 is dry etched as shown in FIGS. 31A and 31B, thereby forming trenches 115, which are gate-electrode trenches. As in the embodiment described above, the trenches 115 are formed in line-shaped patterns extending in a predetermined direction, which is the Y direction of FIG. 1. The predetermined direction intersects active regions K.

In the embodiment described above, the silicon layer of the semiconductor substrate is etched to a greater depth than the element isolation trench as shown in FIGS. 8A and 8B. Conversely, in the one embodiment of the present invention, the element isolation trench 53 is etched to a greater depth than the trench 115 of the semiconductor substrate 50, so that a convex portion 50A can be formed on the semiconductor substrate 50 and used as a channel region of a cell transistor.

Figure 32A:
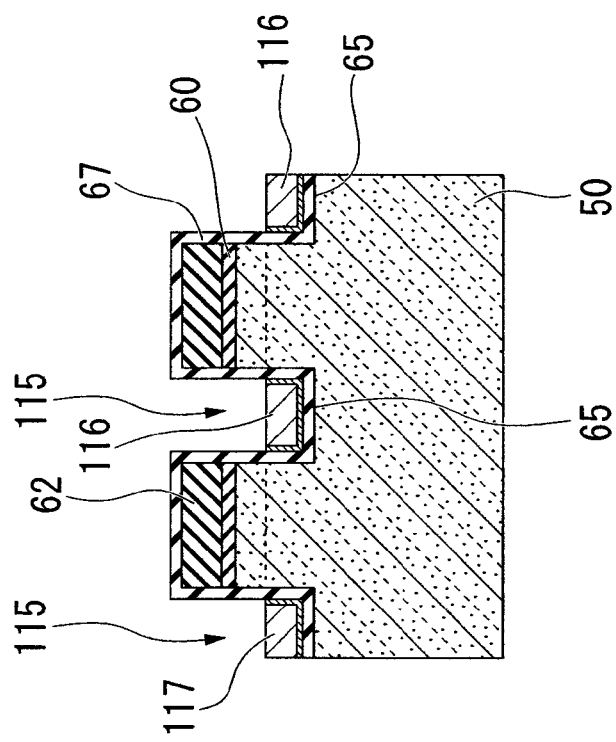
FIG. 32A is a fragmentary cross sectional elevation view, taken along an A-A' line of FIG. 1, illustrating a memory cell including a semiconductor device in accordance with another embodiment of the present invention.
Figure 32B:
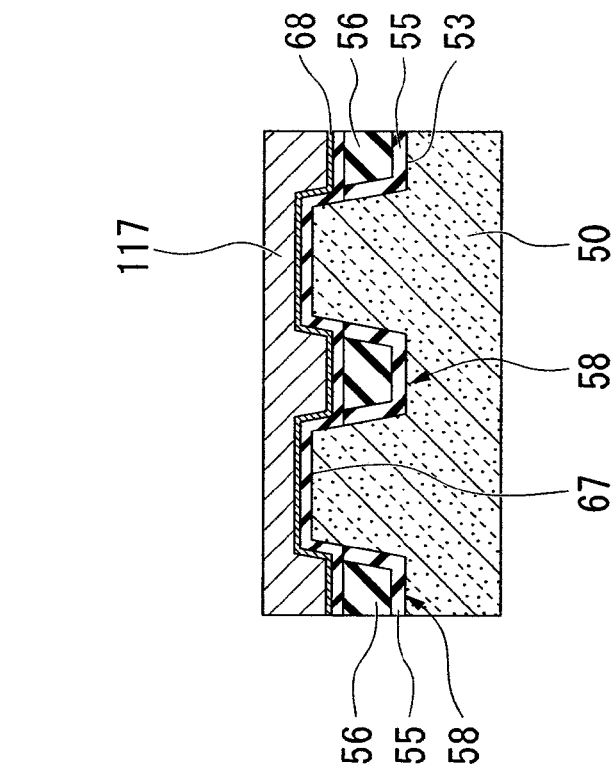
FIG. 32B is a fragmentary cross sectional elevation view, taken along a B-B' line of FIG. 1, illustrating a memory cell including a semiconductor device in accordance with another embodiment of the present invention.

Afterwards, in the same manner as described in the embodiment with reference to FIGS. 9A and 9B, a gate insulating layer 67, a titanium nitride layer 68, and a tungsten layer 69 may be formed and etched back. Hence, a buried word line 116 or a buried line 117 within the trench, which are the gate-electrode trench, is formed as shown in FIGS. 32A and 32B. Thus, subsequent processes of the process shown in FIGS. 11A and 11B are sequentially performed on the resultant structure of FIGS. 32A and 32B like in the embodiment described above, thereby fabricating the semiconductor memory device 111 having the sectional structure shown in FIGS. 30A and 30B.

In the semiconductor memory device 111 having the saddle fin cell transistor according to the one embodiment of the present invention, the channel region is a portion of the convex unit 50A formed in the surface of the semiconductor substrate 50. Also, the channel region is wider than in the semiconductor memory device 1 according to the embodiment described above. Accordingly, the saddle fin cell transistor according to the one embodiment of the present invention may allow the flow of a larger current as compared with the recess-type transistor according to the embodiment described above.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
a semiconductor substrate;
a first trench in the semiconductor substrate having a first trench side surface and a second trench side surface opposing the first trench side surface in a first direction;
a first gate insulating layer covering an inner surface of the first trench; a first buried word line disposed on a surface of the first gate insulating layer, and filling a bottom portion of the first trench;
a first buried insulating layer disposed on an upper surface of the first buried word line, and filling an upper portion of the first trench;
a second trench in the semiconductor substrate having a third trench side surface and a fourth trench side surface opposing the third trench side surface in the first direction, and being adjacent to the first trench in the first direction;
a second gate insulating layer covering an inner surface of the second trench;
a second buried word line disposed on a surface of the second gate insulating layer, and filling a bottom portion of the second trench;
a second buried insulating layer disposed on an upper surface of the second buried word line, and filling an upper portion of the second trench;
an impurity region in an upper portion of the semiconductor substrate between the second trench side surface and the third trench side surface, and having a top surface, a first side surface and a second side surface opposing the first side surface in the first direction,
an interlayer insulating layer covering the first trench, the second trench and the impurity region, respectively;
a contact hole in the interlayer insulating layer, and having a bottom surface comprising the top surface of the impurity region, a surface of a first recess portion disposed on an upper surface of the first buried insulating layer and contacting the first side surface, and a surface of a second recess portion disposed on an upper surface of the second buried insulating layer and contacting the second side surface; and
a conductive layer filling the contact hole;
wherein the conductive layer is in contact with the top surface, the first side surface and the second side surface of the impurity region respectively, the conductive layer in the first recess portion is insulated from the first buried word line by the first buried insulating layer, and the conductive layer in the second recess portion is insulated from the second buried word line by the second buried insulating layer.

2. The semiconductor device according to claim 1, wherein the contact hole has a first hole side surface and a second hole side surface opposing the first hole side surface in the first direction, the first hole side surface disposed on the first buried insulating layer and constituting an one side surface of the first recess portion and the second hole side surface disposed on the second buried insulating layer and constituting an one side surface of the second recess portion.

3. The semiconductor device according to claim 1, wherein the conductive layer has protrude portions filling the first recess portion and the second recess portion, respectively, and the protrude portions protrude into the semiconductor substrate from the top surface of the impurity region.

4. The semiconductor device according to claim 1, wherein the impurity region comprises a high concentration impurity diffusion layer and a low concentration impurity diffusion layer underlying the high concentration impurity diffusion layer.

5. The semiconductor device according to claim 1, wherein the conductive layer comprises a lower layer of a doped polysilicon, and wherein the lower layer is in contact with the impurity region.

6. The semiconductor device according to claim 1, wherein the conductive layer comprises a metal layer over the doped polysilicon.

7. The semiconductor device according to claim 1, wherein the conductive layer is a wiring layer, and wherein the impurity region is one of a source region and a drain region of a transistor.

* * * * *